United States Patent
Kim et al.

(10) Patent No.: US 10,854,846 B2
(45) Date of Patent: Dec. 1, 2020

(54) ELECTROLUMINESCENT DISPLAY APPARATUS

(71) Applicant: LG Display Co., Ltd., Seoul (KR)

(72) Inventors: TaeRyong Kim, Seoul (KR); TaeHyun Min, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/714,211

(22) Filed: Dec. 13, 2019

(65) Prior Publication Data
US 2020/0212356 A1    Jul. 2, 2020

(30) Foreign Application Priority Data

Dec. 31, 2018 (KR) .......................... 10-2018-0173270

(51) Int. Cl.
*H01L 51/52* (2006.01)
*H01L 27/32* (2006.01)
*G09G 3/00* (2006.01)

(52) U.S. Cl.
CPC ......... *H01L 51/5253* (2013.01); *G09G 3/006* (2013.01); *H01L 27/3246* (2013.01); *H01L 27/3258* (2013.01); *H01L 27/3276* (2013.01)

(58) Field of Classification Search
CPC ... H01L 33/486; H01L 33/502; H01L 33/505; H01L 33/507; H01L 33/54; H01L 33/56; H01L 2933/0041; H01L 27/3256
See application file for complete search history.

(56) References Cited

U.S. PATENT DOCUMENTS

| | | |
|---|---|---|
| 9,923,167 B2 | 3/2018 | Choi et al. |
| 10,199,602 B2 | 2/2019 | Choi et al. |
| 2016/0260928 A1 | 9/2016 | Choi et al. |
| 2018/0158894 A1* | 6/2018 | Park .................. H01L 51/5253 |
| 2018/0198092 A1 | 7/2018 | Choi et al. |
| 2019/0057632 A1* | 2/2019 | Kim .................... G09G 3/3291 |

FOREIGN PATENT DOCUMENTS

KR     10-2016-0108800 A    9/2016

* cited by examiner

*Primary Examiner* — Zandra V Smith
*Assistant Examiner* — Andre C Stevenson
(74) *Attorney, Agent, or Firm* — Fenwick & West LLP

(57) ABSTRACT

An electroluminescent display apparatus includes a substrate including a display area and a non-display area which surrounds the display area, a crack detecting unit on the substrate in the non-display area, an interlayer insulating layer disposed so as to cover the crack detecting unit, a power supply electrode which is located on the interlayer insulating layer and is disposed between the crack detecting unit and the display area, a protective layer disposed so as to cover the power supply electrode; a planarizing layer which is located on the protective layer and is disposed so as to overlap the crack detecting unit, and an alignment reference unit which is located on the planarizing layer and overlaps the crack detecting unit.

24 Claims, 8 Drawing Sheets

ELECTROLUMINESCENT DISPLAY APPARATUS

CROSS-REFERENCE TO RELATED APPLICATIONS

This application claims the benefit of Republic of Korea Patent Application No. 10-2018-0173270 filed on Dec. 31, 2018, which is incorporated herein by reference.

BACKGROUND

Field of Technology

The present disclosure relates to an electroluminescent display apparatus.

Description of the Related Art

Currently, as it enters a full-scale information era, a field of a display apparatus which visually expresses electrical information signals has been rapidly developed and studies are continued to improve performances of various display apparatuses such as a thin thickness, a light weight, and low power consumption. A representative example of the display apparatus may include a liquid crystal display device (LCD), an electroluminescent display device, and a micro-LED display device.

The electroluminescent display apparatus is a self-emitting display apparatus so that a separate light source is not necessary, which is different from the liquid crystal display apparatus. Therefore, the electroluminescent display apparatus may be manufactured to have light weight and small thickness. Further, the electroluminescent display apparatus is driven at a low voltage to be advantageous not only in terms of power consumption, but also in terms of response speed, the viewing angle, and the contrast ratio, so that the electroluminescent display apparatus is being studied as next generation displays.

The electroluminescent display apparatus displays images by disposing sub pixels having a light emitting device in a matrix and selectively controlling the sub pixels with a data voltage and a scan voltage.

In this case, the electroluminescent display apparatus is classified into a passive matrix type and an active matrix type which uses a thin film transistor (TFT) as a switching element. Between two types, according to the active matrix type, a TFT which is an active element is selectively turned on to select a sub pixel and maintain the emission of the sub pixel with a voltage sustained in a storage capacitor. In a normal electroluminescent display apparatus, in order to avoid the degradation of visibility due to reflection of external light, a polarizer is applied to an upper surface of a display panel. However, when the polarizer is not attached to the display panel at an accurate position, the color tone becomes abnormal at a side viewing angle. Further, when a back plate is disposed on a rear surface of a substrate to support the substrate, there is a problem in that a process yield is lowered due to misalignment of the back plate and the substrate.

SUMMARY

Inventors of the present disclosure studied to attach a polarizer or dispose the back plate in an accurate position of an upper surface of a display panel or a rear surface of a substrate to improve display quality of an electroluminescent display apparatus. The inventors of the present disclosure recognized that when an alignment reference unit is formed in a non-display area of the electroluminescent display apparatus, the polarizer or the back plate can be accurately aligned in the display panel.

Therefore, an object to be achieved by the present disclosure is to provide an electroluminescent display apparatus which employs an alignment reference unit.

Further, an alignment reference unit is formed on a substrate to accurately align a substrate and a back plate or a display panel and a polarizer in an electroluminescent display apparatus. However, when the alignment reference unit is formed in a specific area, a step is caused between an area where the alignment reference unit is formed and an area where the alignment reference unit is not formed, which may adversely affect the processes after the process of forming the alignment reference unit so that the reliability of the display apparatus is degraded.

Therefore, another object to be achieved by the present disclosure is to provide an electroluminescent display apparatus in which a step is not generated between the area where the alignment reference unit is formed and the area where the alignment reference unit is not formed.

Objects of the present disclosure are not limited to the above-mentioned objects, and other objects, which are not mentioned above, can be clearly understood by those skilled in the art from the following descriptions.

According to an aspect of the present disclosure, an electroluminescent display apparatus includes a substrate including a display area that displays an image and a non-display area enclosing the display area, the non-display not displaying the image. At least one crack detecting unit is on the non-display area of the substrate, and an interlayer insulating layer covers the crack detecting unit. A power supply electrode configured to supply a voltage is on the interlayer insulating layer and is disposed between the crack detecting unit and the display area. A protective layer covers the power supply electrode, and a planarizing layer overlaps the at least one crack detecting unit. An alignment reference unit in the non-display area of the substrate is on the planarization layer and overlaps the crack detecting unit in the non-display area.

According to another aspect of the present disclosure, an electroluminescent display apparatus includes a substrate including a display area that displays an image and a non-display area enclosing the display area. A first crack detecting unit and a second crack detecting unit in the non-display area of the substrate are configured to identify a crack in the electroluminescent display apparatus. An alignment reference unit is integrally formed with the first crack detecting unit of a same material as the first crack detecting unit. A power supply electrode disposed in the non-display area between the second crack detecting unit and the display area supplies power to the light emitting device included in the electroluminescent display apparatus. At least one dam is disposed between the second crack detecting unit and the display area such that at least one dam overlaps the power supply electrode.

According to another aspect of the present disclosure, an electroluminescent display apparatus includes a substrate including a display area and a non-display area surrounding the display area on a front surface of the substrate. A light emitting device is in the display area of the substrate. A first crack detecting unit and a second crack detecting unit are in the non-display area, and the first crack detecting unit and the second crack detecting unit are configured to identify one or more cracks in the electroluminescent display apparatus. An alignment reference unit is in the non-display area of the substrate. A back plate is coupled to a rear surface of the substrate, the back plate aligned with the alignment reference unit.

Other detailed matters of the exemplary embodiments are included in the detailed description and the drawings.

According to the present disclosure, the alignment reference unit which overlaps the crack detecting unit is disposed in a non-display area so that a back plate which supports a rear surface of the substrate is accurately disposed on the rear surface of the substrate. Further, the alignment reference unit disposed in the non-display area serves as a guide so that the polarizer disposed on an encapsulating unit of a substrate is attached without causing misalignment.

Further, according to the present disclosure, the alignment reference unit is configured to be integrated with a first crack detecting unit or a second crack detecting unit so that a separate layer for configuring the alignment reference unit may not be disposed on an upper surface of a planarization layer disposed in an area corresponding to the first crack detecting unit and the second crack detecting unit. In the area where the alignment reference unit is disposed and the area where the alignment reference unit is not disposed, a laminated structure disposed on the planarization layer disposed in the area corresponding to the first crack detecting unit and the second crack detecting unit may be the same. Therefore, a display apparatus in which a step is not caused between the area where the alignment reference unit is disposed and the area where the alignment reference unit is not disposed may be provided.

Further, according to the present disclosure, the alignment reference unit is configured to be integrated with the first crack detecting unit and the second crack detecting unit to electrically connect the first crack detecting unit and the second crack detecting unit to each other. Therefore, the first crack detecting unit and the second crack detecting unit may be formed as a plurality of parallel connection structures. Further, when cracks are generated in the first crack detecting unit and the second crack detecting unit due to an external force, a change of a resistance of the first crack detecting unit and the second crack detecting unit which are connected as a plurality of parallel structures by the alignment reference unit is measured, to identify a crack generating position and the number of cracks.

The effects according to the present disclosure are not limited to the contents exemplified above, and more various effects are included in the present specification.

BRIEF DESCRIPTION

The above and other aspects, features and other advantages of the present disclosure will be more clearly understood from the following detailed description taken in conjunction with the accompanying drawings, in which.

DETAILED DESCRIPTION

Figure 1:
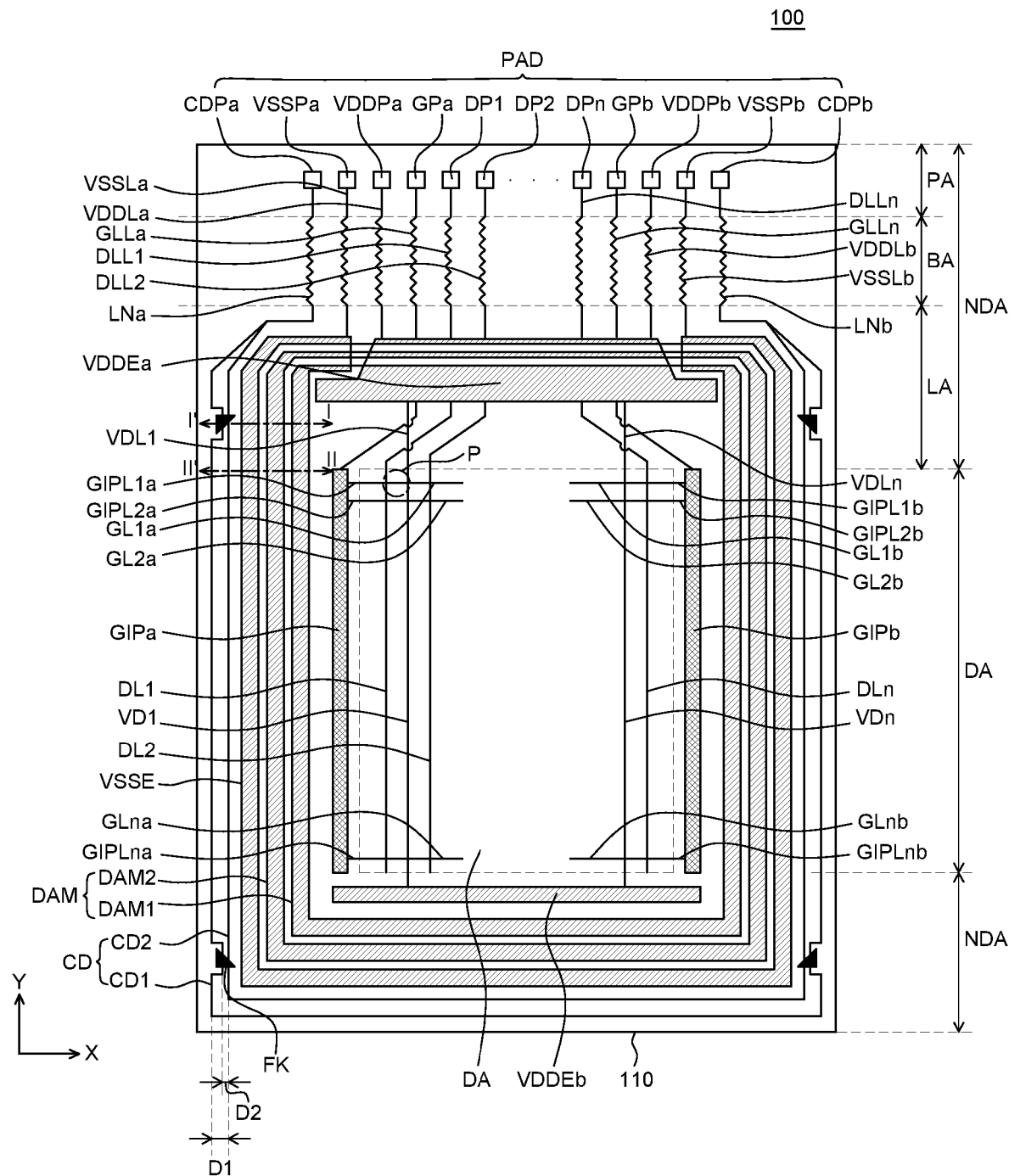
FIG. 1 is a plan view of an electroluminescent display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, the other element may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, an electroluminescent display apparatus according to exemplary embodiments of the present disclosure will be described in detail with reference to accompanying drawings.

FIG. 1 is a schematic plan view of an electroluminescent display apparatus according to an exemplary embodiment of the present disclosure. Referring to FIG. 1, a display apparatus 100 includes a display area DA which displays information and a non-display area NDA in which information is not displayed. The non-display area NDA surrounds the display area DA in one embodiment.

The display area DA is an area where a plurality of sub pixels P is disposed in a matrix and input images are displayed. The non-display area NDA may include a pad area PA in which a pad unit is disposed, a bending area BA in which a substrate 110 is bent, and a link area LA.

The link area LA may be disposed between the display area DA and a bending area BA. The link area LA is an area where link lines which transmit signals to wiring lines disposed in the display area DA are disposed, and various link lines may be disposed therein. For example, gate link lines GLLa and GLLb (hereinafter, referred to as GLL), data link lines DLL1 to DLLn (hereinafter, referred to as DLL), first power link lines VDDLa and VDDLb (hereinafter, referred to as VDDL), first power supply lines VDL1 to VDLn (hereinafter, referred to as VDL), and second power link lines VSSLa and VSSLb (hereinafter, referred to as VSSL) may be disposed in the link area LA. The link lines may also be disposed in the bending area BA and the pad area PA and may be connected to the pads PAD of the pad area PA.

The bending area BA may be an area where the substrate 110 is bent. The bending area BA may be disposed between the link area LA and the pad area PA. The substrate 110 may be maintained to be flat without being bent in an area except the bending area BA and the substrate 110 of the bending area BA is bent. Therefore, the display apparatus 100 may be bent such that substrates 110 in two non-bending areas excluding the bending area BA of the substrate 110 face each other.

The pad area PA may be an area in which no image is displayed and a plurality of pads is formed. The pad area PA may be an area extending from one side of the bending area BA. The pad area PA may be an area where pads PAD are disposed. For example, first power supply pads VDDPa and VDDPb (hereinafter, referred to as VDDP), data pads DP1 to DPn (hereinafter, referred to as DP), gate pads GPa and GPb (hereinafter, referred to as GP), second power supply pads VSSPa and VSSPb (hereinafter, referred to as VSSP), and crack detecting pads CDPa and CPDb (hereinafter, referred to as CDP) may be disposed.

In the non-display area NDA, gate drivers GIPa and GIPb (hereinafter, referred to as GIP) as a gate driving circuit, gate voltage supply lines GIPL1a to GIPLna (referred to as GIPLa), and GIPL1b to GIPLnb (referred to as GIPLb) (hereinafter, referred to as GIPL), a second power supply electrode VSSE, and first power supply electrodes VDDEa and VDDEb (hereinafter, referred to as VDDE), dams DAM1 and DAM2 (hereinafter, referred to as DAM), an alignment reference unit FK, and crack detecting units CD1 and CD2 (hereinafter, referred to as CD) may be disposed.

Further, in the display area DA, data lines DL1 to DLn (hereinafter, referred to as DL) and gate lines GL1a to GLna (referred to as GLa), and GL1b to GLnb (referred to as GLb) (hereinafter, referred to as GL) are disposed to intersect each other. Sub Pixels P which are disposed in a matrix may be included in every intersection area.

Each sub pixel P includes a light emitting device, a driving thin film transistor (hereinafter, referred to as a driving TFT) which controls a current amount flowing into the light emitting device, and a programming unit for setting a gate-source voltage of the driving TFT. The sub pixels P of the display apparatus 100 may be supplied with a first power Vdd which is a high potential voltage, through the first power lines VD1 to VDn (hereinafter, referred to as VD) connected to the first power supply electrode VDDE disposed in the non-display area NDA and supplied with a second power Vss which is a low potential voltage through the second power supply electrode VSSE.

The first power supply line VD may be supplied with the first power Vdd through the first power supply electrode VDDE disposed in the non-display area NDA. The first power Vdd supplied through the first power supply electrode VDDE may be supplied to the first power line VD disposed in the display area DA through the first power supply line VDL. For example, the first power Vdd may be supplied to the first power supply pad VDDP of the pad area PA. The first power Vdd supplied to the first power supply pad VDDP may be supplied to a 1a-th power supply electrode VDDEa of the link area LA through the first power link line VDDL. The first power Vdd supplied to the 1a-th power supply electrode VDDEa may be supplied to the first power line VD of the display area DA through the first power supply line VDL of the link area LA. One side of the first power line VD is connected to the 1a-th power supply electrode VDDEa and the other side of the first power line VD is connected to a 1b-th power supply electrode VDDEb.

The 1a-th power supply electrode VDDEa may be disposed between the bending area BA and the display area DA. The 1b-th power supply electrode VDDEb may be disposed to be opposite to the 1a-th power supply electrode VDDEa with the display area DA therebetween. Widths of both ends of the 1a-th power supply electrode VDDEa may be smaller than a width of a center portion of the 1a-th power supply electrode VDDEa. Both ends of the 1a-th power supply electrode VDDEa may be disposed between the second power supply electrode VSSE and the display area DA. For example, the 1a-th power supply electrode VDDEa may include a first area having a first line width and a second area having a second line width which is larger than the first line width. The first area may be both ends of the 1a-th power supply electrode VDDEa and the second area may be a center portion of the 1a-th power supply electrode VDDEa.

The second power Vss may be supplied to the second power link line VSSL of the non-display area NDA through the second power supply pad VSSP of the pad area PA. The second power Vss supplied to the second power link line VSSL may be supplied to the sub pixel P of the display area DA through the second power supply electrode VSSE. For example, the second power Vss may be supplied to a 2a-th power link line VSSLa and a 2b-th power link line VSSLb of the second power link line VSSL connected to the second power supply pad VSSP located in the pad. Further, the second power Vss supplied to the 2a-th power link line VSSLa and the 2b-th power link line VSSLb of the second power link line VSSL may be supplied to the sub pixel P of the display area DA through the second power supply electrode VSSE. The 2a-th power link line VSSLa of the second power link line VSSL may be connected to one side of the second power supply electrode VSSE to supply the second power Vss. The 2b-th power link line VSSLb of the second power link line VSSL may be connected to the other side of the second power supply electrode VSSE to supply the second power Vss.

Referring to FIG. 1, in the non-display area NDA, the second power supply electrode VSSE may be disposed to surround at least a first side, a second side, and a third side of the display area DA. The ends of the second power supply electrode VSSE may extend along a portion of a fourth side of the display area DA. A portion of the second power supply electrode VSSE that surrounds the first side, the second side, and the third side of the display area DA has a first line width, and the ends of the second power supply electrode VSSE along the fourth side has a second line width smaller than the first line width. Both ends of the second power supply electrode VSSE may be disposed in the link area LA to be opposite to each other. Further, in the link area LA, ends of the 1a-th power supply electrode VDDEa have a first line width which is smaller than a portion of the 1a-th power supply electrode VDDEa between the ends with a second line width. An end of the 1a-th power supply electrode VDDEa may be disposed between one end of the second power supply electrode VSSE and the display area DA. In the link area LA, the other end of the 1a-th power supply electrode VDDEa having a first line width may be disposed between the other end of the second power supply electrode VSSE and the display area DA.

The sub pixel P may include at least one switching TFT and at least one storage capacitor. The switching TFT is turned on in response to a scan signal from the gate lines GL to apply a data voltage from the data lines DL to one electrode of the storage capacitor. The driving TFT may control a current amount supplied to the light emitting device in accordance with a magnitude of the voltage charged in the storage capacitor to control an emission amount of the light emitting device. An emission amount of the light emitting device may be proportional to a current amount supplied from the driving TFT. Further, a semiconductor layer of TFTs which configure a sub pixel P may include at least one of amorphous silicon, polysilicon, and an oxide semiconductor material. The light emitting device may include an anode electrode, a cathode electrode, and an emission structure interposed between the anode electrode and the cathode electrode. The anode electrode may be connected to the driving TFT. The emission structure includes an emission layer (EML) and a hole injection layer (HIL) and a hole transport layer (HTL) are disposed at one side of the emission layer and an electron injection layer (EIL) and an electron transport layer (ETL) are disposed at the other side, with the emission layer therebetween.

The data voltage may be supplied to the data link line DLL of the non-display area NDA through the data pad DP of the pad area PA. The data voltage supplied to the data link line DLL may be supplied to the data line DL of the display area DA.

The gate driving voltage may be supplied to the gate link line GLL of the non-display area NDA through the gate pad GP of the pad area PA. The gate driving voltage supplied to the gate link line GLL may be supplied to the gate driver GIP. The gate driving voltage may be supplied to the gate line GL of the display area DA through the gate voltage supply line GIPL connected to the gate driver GIP. The gate driving voltage may include a gate high voltage VGH and a gate low voltage VGL. The gate driver GIP may also be supplied with signals such as a start pulse, gate shift clocks, and a flicker signal as well as the gate driving voltage. The start pulse, the gate shift clocks, and the flicker signal may swing between 0 V and 3.3 V. The gate shift clocks may be n-phase clock signals having a predetermined phase difference. The gate high voltage VGH is a voltage higher than a threshold voltage of a thin film transistor TFT formed in a thin film transistor array of the display apparatus 100 and may be approximately 28 V. The gate low voltage VGL is a voltage lower than a threshold voltage of a thin film transistor TFT formed in a thin film transistor array of the display apparatus 100 and may be approximately −5 V, but is not limited thereto.

The gate driver GIP may include a first gate driver GIPa disposed at a left side of the display area DA and a second gate driver GIPb disposed at a right side of the display area DA. In one embodiment, the second gate driver GIPb is parallel to the first gate driver GIPa. The first gate driver GIPa may be supplied with the gate driving voltage through the first gate link line GLLa of the gate link line GLL. The second gate driver GIPb may be supplied with the gate driving voltage through the second gate link line GLLb of the gate link line GLL. Further, the gate driving voltage supplied to the first gate driver GIPa may be supplied to the first gate line GL1a to GLna (hereinafter, referred to as GLa) of the gate lines GL through the first gate voltage supply line GIPL1a to GIPLna (hereinafter, referred to as GIPLa) of the gate voltage supply line GIPL. Further, the gate driving voltage supplied to the second gate driver GIPb may be supplied to the second gate line GL1b to GLnb (hereinafter, referred to as GLb) of the gate line GL through the second gate voltage supply line GIPL1b to GIPLnb (hereinafter, referred to as GIPLb) of the gate voltage supply line GIPL.

The gate driver GIP may be disposed between the second power supply electrode VSSE and the display area DA.

Even though in FIG. 1, it is illustrated that the gate driver GIP is disposed to be adjacent to both sides of the display area DA to supply a gate pulse from both sides of the display area DA to the gate line GL, the present disclosure is not limited thereto. The gate driver may be disposed to be adjacent to only one side of the display area DA so that one side of the display area DA may supply the gate pulse to the gate line GL. When the gate driver GIP is disposed on both sides of the outside of the display area DA, a gate pulse having the same phase and the same amplitude may be supplied to the sub pixel P disposed on the same horizontal line through the gate line GL.

A dam DAM may be disposed on the second power supply electrode VSSE. The dam may be disposed to overlap the second power supply electrode VSSE. Further, the dam is disposed to surround four sides of the display area DA to block the flow of an organic material layer of an encapsulating unit disposed on the light emitting device LED of the sub pixel P. The dam may include a first dam DAM1 and a second dam DAM2. The first dam DAM1 and the second dam DAM2 may be disposed to be spaced apart from each other and the first dam DAM1 may be disposed between the second dam DAM2 and the display area DA.

Referring to FIG. 1, a crack detecting unit CD which detects a crack of the display panel may be disposed in the non-display area NDA. The crack detecting unit CD includes a first crack detecting unit CD1 disposed along an outer edge of the second power supply electrode VSSE and a second crack detecting unit CD2 disposed between the first crack detecting unit CD1 and the second power supply electrode VSSE. The first crack detecting unit CD1 and the second crack detecting unit CD2 are spaced apart from each other and from the second power supply electrode VSSE such that the first crack detecting unit CD1 and the second crack detecting unit CD2 are not in contact with the second power supply electrodes VSSE.

A first end of the first crack detecting unit CD1 may be connected to a first end of the second crack detecting unit CD2 in the linking area LA. A second end of the first crack detecting unit CD1 may be connected to a second end of the second crack detecting unit CD2 in the linking area LA. A first crack detecting pad CDPa of the crack detecting pad CDP is connected to the first ends of the first crack detecting unit CD1 and the second crack detecting unit CD2 and a second crack detecting pad CDPb of the crack detecting pad CDP is connected to the second ends of the first crack detecting unit CD1 and the second crack detecting unit CD2.

In one embodiment, the first crack detecting pad CDPa and the second crack detecting pad CDPb are disposed in the pad area PA. A line LNa extends from the first ends of the first crack detecting unit CD1 and the second crack detecting unit CD2 to electrically connect the first ends to the first crack detecting pad CDPa through the bending area BA. Similarly, a line LNb extends from the second ends of the first crack detecting unit CD1 and the second crack detecting unit CD2 to electrically connect the second ends to the second crack detecting pad CDPb through the bending area BA.

When a crack is generated in the display panel due to the external force, the change in the resistance of the crack detecting unit CD is measured using the crack detecting pad CDP to detect the crack generated in the display panel. It can be detected by measuring a change in the resistance between the crack detecting pad CDPa and the crack detecting pad CDP.

Referring to FIG. 1, one or more alignment reference units FK may be disposed on the crack detecting unit CD in the non-display area NDA. The alignment reference unit FK may be disposed so as to overlap the first crack detecting unit CD1 and the second crack detecting unit CD2 of the crack detecting unit CD. The alignment reference unit FK may serve as a guide to accurately dispose the back plate which supports the rear surface of the substrate 110. In some embodiments, the back plate may include a groove that is aligned with the alignment reference unit FK such that the back plate is accurately placed onto the rear surface of the substrate 110. The groove may be disposed in an area adjacent to the alignment reference unit FK. Alternatively, the alignment reference unit FK may serve as a guide to attach a polarizer which is disposed on the display panel without causing misalignment. Similar to the back plate, the polarizer may include a groove or other markers for aligning with the alignment reference unit FK.

The alignment reference unit FK may be disposed in an area adjacent to the display area DA. In FIG. 1, even though two alignment reference units are disposed at the left side of the display area DA and two alignment reference units are disposed at the right side of the display area DA, the present disclosure is not limited thereto. For example, three alignment reference units FK may be disposed at the left side and three alignment reference units FK may be disposed at the right side. Further, the shape of the alignment reference unit FK may be a polygon such as a triangle or a rectangle.

Further, in an area where the alignment reference unit FK overlaps the first crack detecting unit CD1 and the second crack detecting unit CD2, the first crack detecting unit CD1 and the second crack detecting unit CD2 may be spaced apart from each other with a second distance D2. In an area where the alignment reference unit FK is not disposed, the first crack detecting unit CD1 and the second crack detecting unit CD2 may be spaced apart from each other with a first distance D1. However, as illustrated in FIG. 1, in an area where the alignment reference unit FK is disposed to overlap the first crack detecting unit CD1 and the second crack detecting unit CD2, the first crack detecting unit CD1 and the second crack detecting unit CD2 may be spaced apart from each other with the second distance D2 which is shorter than the first distance D1.

Hereinafter, components of the display apparatus 100 according to an exemplary embodiment of the present disclosure will be described in more detail with reference to FIGS. 2 to 3B.

Figure 2:
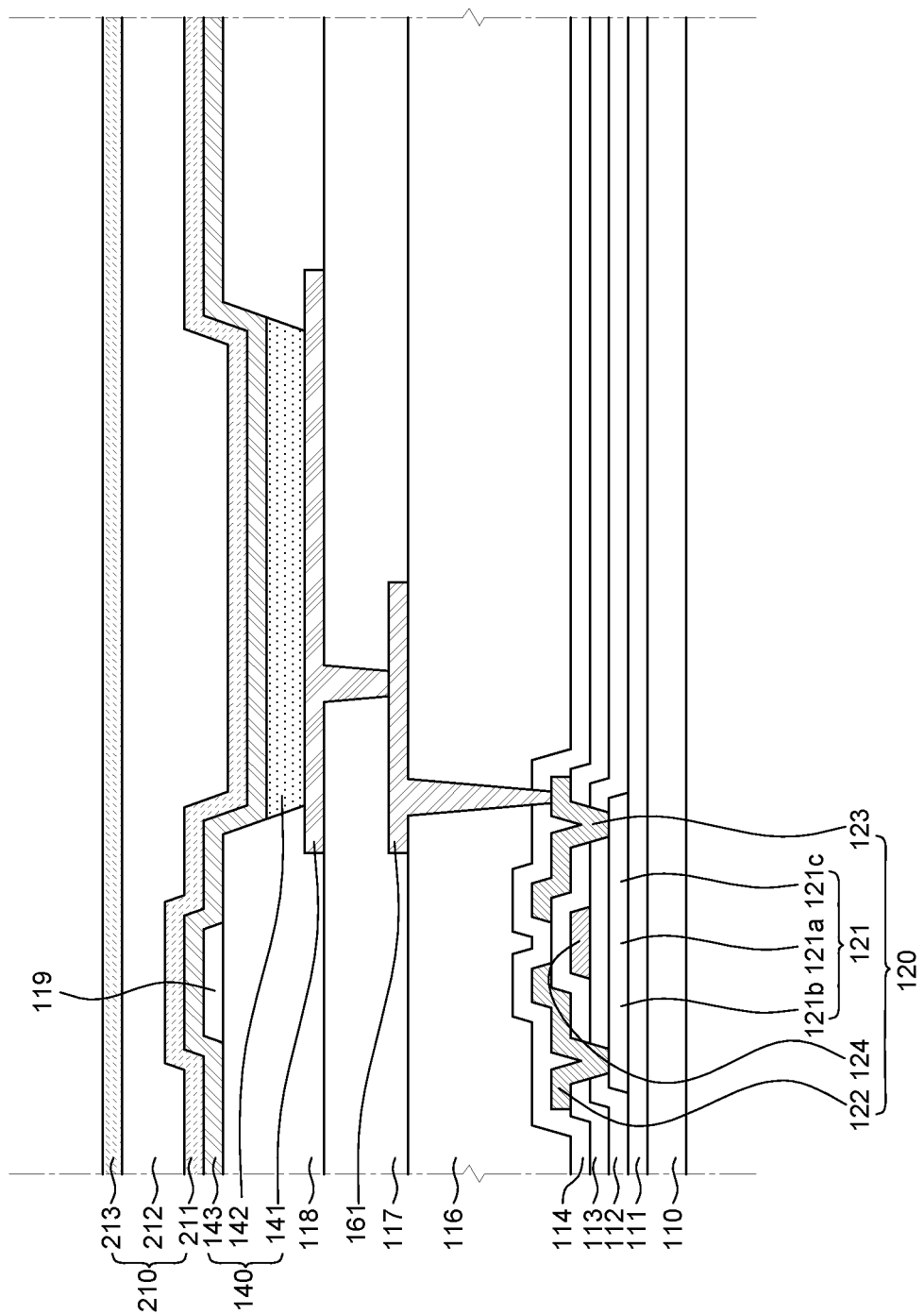
FIG. 2 is a view illustrating a cross-sectional structure of a sub pixel.

FIG. 2 is a view illustrating a cross-sectional structure of a sub pixel P in a display apparatus 100 according to an exemplary embodiment of the present disclosure. The sub pixel may include a substrate 110, a buffer layer 111, a thin film transistor 120, a gate insulating layer 112, an interlayer insulating layer 113, a protective layer 114, a first planarizing layer 116, a second planarizing layer 117, a bank 118, an auxiliary electrode 161, a spacer 119, a light emitting device 140, and an encapsulating unit 210.

The substrate 110 may be formed of a plastic material having flexibility. When the substrate 110 is formed of a plastic material, for example, the substrate may be formed of polyimide (PI). When the substrate 110 is formed of polyimide (PI), the manufacturing process of the display apparatus is performed under a circumstance when a support substrate formed of glass is disposed below the substrate 110 and the support substrate may be released after completing the manufacturing process of the display apparatus. Further, after releasing the support substrate, a back plate which supports the substrate 110 may be disposed below the substrate 110.

When the substrate 110 is formed of polyimide (PI), moisture components pass through the substrate 110 formed of polyimide (PI) to permeate the thin film transistor 120 or the light emitting device 140 so that the performance of the display apparatus 100 may be deteriorated. The display apparatus 100 according to the exemplary embodiment of the present disclosure may configure the substrate 110 by a double base layer to suppress the deterioration of the performance of the display apparatus 100 due to the moisture permeation. Further, a silicon oxide (SiOx) layer having an excellent moisture blocking effect is formed between double base layers so that the moisture component is blocked from passing through the lower base layer. Therefore, the reliability of the performance of the product may be improved.

Further, charges in the base layer which configures the substrate 110 forms a back bias that affect the first thin film transistor 120. Therefore, in order to block the charges in the base layer, a separate metal layer may be disposed between the substrate 110 and the first thin film transistor 120. Alternatively, an inorganic layer is formed between two polyimide (PI) to block charges in lower polyimide (PI), thereby improving the reliability of the product.

In the bending area BA of the substrate 110, the adhesiveness between the silicon oxide (SiOx) layer disposed between the double base layer and the base layer may be deteriorated due to the moisture. Further, due to the deteriorated adhesiveness between the silicon oxide (SiOx) layer and the base layer, when stress is applied to the substrate 110 in the bending area BA, the base layer is separated from the double base layer. Therefore, the reliability of the product may be deteriorated due to the loosening phenomenon of the base layer of the substrate 110. Therefore, in the display apparatus according to an exemplary embodiment of the present disclosure, in order to have a strong structure against the bending while improving the environmental reliability such as suppression of moisture permeation, an inorganic insulating layer disposed between double base layers may be formed as a double layer including a silicon oxide (SiOx) layer and a silicon nitride (SiNx) layer. However, the present disclosure is not limited thereto, and the inorganic insulating layer may be formed as a triple layer including a silicon oxide (SiOx) layer and a silicon nitride (SiNx) layer.

Referring to FIG. 2, the buffer layer 111 having a single layer or a multi-layered structure may be disposed on the substrate 110. The buffer layer 111 disposed on the substrate 110 may be formed by a single layer of silicon nitride SiNx or silicon oxide SiOx or a multi-layer thereof.

The buffer layer 111 may serve to improve adhesiveness between layers formed on the buffer layer 111 and the substrate 110 and block alkali metal ion components leaked from the substrate 110. The buffer layer 111 is not an essential component and may be omitted based on a type or a material of the substrate 110 and a structure and a type of a thin film transistor.

According to the exemplary embodiment of the present disclosure, the buffer layer 111 may be formed as a multi-layer in which silicon dioxide $SiO_2$ and silicon nitride SiNx are alternately formed.

In the display area DA of the substrate 110, the thin film transistor 120 for driving the light emitting device 140 may be disposed on the buffer layer 111. The thin film transistor 120 includes an active layer 121, a gate electrode 124, a source electrode 122, and a drain electrode 123. Here, depending on the design of the sub pixel circuit, the source electrode 122 may serve as a drain electrode and the drain electrode 123 may serve as a source electrode. In the display area DA of the substrate 110, the active layer 121 of the thin film transistor 120 may be disposed on the buffer layer 111.

The active layer 121 may include a low temperature poly silicon (LTPS). The polysilicon material has a high mobility (100 $cm^2$/Vs or higher) so that energy power consumption is low and reliability is excellent. Therefore, the polysilicon material may be applied to a gate driver for driving elements which drive thin film transistors for a display element and/or a multiplexer (MUX) and also applied as an active layer of a driving thin film transistor of the display apparatus according to the exemplary embodiment, but is not limited thereto. For example, the polysilicon material may be applied as an active layer of a switching thin film transistor depending on the characteristics of the display apparatus. An amorphous silicon (a-Si) material is deposited on the buffer layer 111 and a dehydrogenation process and a crystallization process are performed to form polysilicon and the polysilicon is patterned to form the active layer 121. The active layer 121 may include a channel region 121a in which a channel is formed at the time of driving the thin film transistor 120 and a source region 121b and a drain region 121c on both sides of the channel region 121a. The source region 121b refers to a portion of the active layer 121 which is connected to the source electrode 122 and the drain region 121c refers to a portion of the active layer 121 which is connected to the drain electrode 123. The source region 121b and the drain region 121c may be configured by ion doping (impurity doping) of the active layer 121. The source region 121b and the drain region 121c may be produced by doping ions into the polysilicon material and the channel region 121a may refer to a part which is not doped with ion and remains with the polysilicon material.

The gate insulating layer 112 may be disposed on the buffer layer 111 to cover an upper surface of the active layer 121 of the thin film transistor 120. The gate insulating layer 112 may be formed as a single layer of silicon nitride SiNx or silicon oxide SiOx or a multi-layer thereof. In the gate insulating layer 112, a contact hole through which the source electrode 122 and the drain electrode 123 of the thin film transistor 120 are connected to the source region 121b and the drain region 121c of the active layer 121 of the thin film transistor 120 may be formed. The gate insulating layer 112 may not be disposed in the bending area BA of the non-display area NDA of the substrate 110.

The gate insulating layer 112 may be formed over the entire substrate 110. However, the present disclosure is not limited thereto. For example, the gate insulating layer 112 may be patterned to have the same width as the gate electrode 124. The gate insulating layer 112 may not be disposed in the bending area BA of the non-display area NDA of the substrate 110.

The gate electrode 124 of the thin film transistor 120 may be disposed on the gate insulating layer 112.

The gate electrode 124 may be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. The gate electrode 124 may be formed on the gate insulating layer 112 to overlap the channel region 121a of the active layer 121 of the thin film transistor 120.

The active layer 121 may be formed of an oxide semiconductor. The oxide semiconductor material has a wide band gap as compared with a silicon material so that electrons cannot jump over the band gap in an off state. Therefore, the oxide semiconductor material has a low off-current. Therefore, the thin film transistor including an active layer which is formed of an oxide semiconductor is suitable for a switching thin film transistor which maintains on-time to be short and off-time to be long, but is not limited thereto. Depending on the characteristic of the display apparatus, the oxide semiconductor may be applied to a driving thin film transistor. Further, due to the small off-current, a magnitude of a parasitic capacitance may be reduced so that the oxide semiconductor may be appropriate for a high-resolution display element. For example, the active layer 121 may be formed of metal oxide and for example, may be formed of various metal oxides such as indium-gallium-zinc-oxide (IGZO). Under assumption that the active layer 121 of the thin film transistor 120 is formed of IGZO, among various metal oxides, it has been described that the active layer is formed based on the IGZO layer, but it is not limited thereto. Therefore, the active layer may be formed of another metal oxide such as indium-zinc-oxide (IZO), indium-gallium-tin-oxide (IGTO), or indium-gallium-oxide (IGO), other than IGZO.

The active layer 121 may be formed by depositing the metal oxide on the buffer layer 111, performing a heat treatment for stabilization, and then patterning the metal oxide.

An insulating material layer and a metal material layer are disposed on the entire surface of the substrate including the active layer 121 such that the metal material layer lies on the insulating material layer and a photoresist pattern is formed on the metal material layer.

The insulating material layer may be formed using a PECVD method and the metal material layer may be formed using a sputtering method.

The metal material layer is subjected to the wet etching with a photoresist pattern PR as a mask to form the gate electrode 124. As a wet etchant for etching the metal material layer, a material which selectively etches molybdenum (Mo), copper (Cu), titanium (Ti), aluminum (Al), chrome (Cr), gold (Au), nickel (Ni), and neodymium (Nd) or an alloy thereof which configure the metal material layer but does not etch the insulating material layer may be used.

The insulating material layer is subjected to the dry etching with the photoresist pattern PR and the gate electrode 124 as masks to form the gate insulating layer 112.

The insulating material layer is etched by the dry etching process so that a pattern of the gate insulating layer 112 may be formed on the active layer 121. A part of the active layer 121 which is exposed by the patterned gate insulating layer 112 may become conductible by the dry etching process.

An active layer 121 including a channel region 121a which is not conductible and a source region 121b and a drain region 121c which are subjected to a conductible treatment at both ends of the active layer 121 may be formed to correspond to an area where the gate electrode 124 is formed.

Resistance of the source region 121b and the drain region 121c of the active layer 121 which become conductible is lowered so that the performance of the thin film transistor 120 is improved. Accordingly, the reliability of the display apparatus 100 according to the exemplary embodiment of the present disclosure is improved.

The channel region 121a of the active layer 121 may be disposed to overlap the gate electrode 124. The source region 121b and the drain region 121c of the active layer 121 may be disposed on both sides of the channel region 121a. The gate insulating layer 112 may be disposed between the gate electrode 124 and the active layer 121. The gate insulating layer 112 may be disposed to overlap the gate electrode 124 and the channel region 121a of the active layer 121.

The gate insulating layer 112 and the gate electrode 124 may be formed to have the same pattern by etching the insulating material layer and the metal material layer using the photoresist pattern PR as a mask. The gate insulating layer 112 may be disposed on the active layer 121. The gate insulating layer 112 may be formed as a single layer of silicon nitride SiNx or silicon oxide SiOx or a multi-layer thereof. The gate insulating layer 112 may be patterned to overlap the channel region 121a of the active layer 121. The gate electrode 124 may be disposed on the gate insulating layer 112. The gate electrode 124 may be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. The gate electrode 124 may be patterned to overlap the active layer 121 and the gate insulating layer 112. The gate electrode 124 may be patterned to overlap the channel region 121a of the active layer 121. The gate insulating layer 112 may be patterned to overlap the channel region 121a of the active layer 121. Accordingly, the gate electrode 124 and the gate insulating layer 112 may overlap the channel region 121a of the active layer 121. The gate insulating layer 112 may be formed as a single layer of silicon oxide SiOx or a multi-layer thereof.

Referring to FIG. 2, the interlayer insulating layer 113 which covers the gate electrode 124 may be disposed on the gate insulating layer 112. The interlayer insulating layer 113 may be formed as a single layer of silicon nitride SiNx or silicon oxide SiOx or a multi-layer thereof. A contact hole through which the source region 121b and the drain region 121c of the active layer 121 of the thin film transistor 120 are exposed may be formed in the interlayer insulating layer 113. Further, as illustrated in FIG. 2, the interlayer insulating layer 113 may be formed over the entire substrate, but is not limited thereto. For example, the interlayer insulating layer 113 may not be disposed in the bending area BA of the substrate 110. Alternatively, the interlayer insulating layer 113 may be formed only in the display area DA.

The source electrode 122 and the drain electrode 123 of the thin film transistor 120 may be disposed on the interlayer insulating layer 113.

The source electrode 122 and the drain electrode 123 of the thin film transistor 120 may be connected to the active layer 121 of the thin film transistor 120 through the contact holes formed in the gate insulating layer 112 and the interlayer insulating layer 113. Therefore, the source electrode 122 of the thin film transistor 120 may be connected to the source region 121b of the active layer 121 through the contact holes formed in the gate insulating layer 112 and the interlayer insulating layer 113. Further, the drain electrode 123 of the thin film transistor 120 may be connected to the drain region 121c of the active layer 121 through the contact holes formed in the gate insulating layer 112 and the interlayer insulating layer 113.

The source electrode 122 and the drain electrode 123 of the thin film transistor 120 may be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. For example, the source electrode 122 and the drain electrode 123 of the thin film transistor 120 may be formed by a triple structure of titanium (Ti)/aluminum (Al)/titanium (Ti) but are not limited thereto.

Referring to FIG. 2, the protective layer 114 may be disposed on the source electrode 122 and the drain electrode 123 of the thin film transistor 120. For example, the protective layer 114 which covers the source electrode 122 and the drain electrode 123 may be disposed on the interlayer insulating layer 113.

The protective layer 114 may be configured by a single layer of silicon nitride SiNx or silicon oxide SiOx or a multi-layer thereof. A contact hole which exposes the drain electrode 123 of the thin film transistor 120 may be formed in the protective layer 114. The protective layer 114 may not be disposed in the bending area BA of the substrate 110.

A contact hole which exposes the drain electrode 123 of the thin film transistor 120 may be formed in the protective layer 114, but it is not limited thereto. For example, a contact hole which exposes the source electrode 122 of the thin film transistor 120 may be formed in the protective layer 114. The protective layer 114 may be configured by a single layer of silicon nitride SiNx or silicon oxide SiOx or a multi-layer thereof. However, the present disclosure is not limited thereto and the protective layer 114 may be an organic material layer which protects the thin film transistor 120 and makes a step on the substrate 110 gentle to planarize an upper portion of the substrate 110. For example, the protective layer 114 may be formed of an organic material such as acryl resin, epoxy resin, phenolic resin, polyamide resin, or polyimide resin.

When the protective layer 114 is formed of an inorganic material layer such as silicon nitride SiNx or silicon oxide SiOx, a first planarization layer 116 may be disposed on the protective layer 114. The first planarizing layer 116 may include a contact hole which exposes the drain electrode 123 of the thin film transistor 120. Further, the first planarizing layer 116 may be an organic material layer which makes the step of the substrate 110 gentle to planarize an upper portion of the substrate 110. For example, the first planarizing layer 116 may be formed of an organic material such as acryl resin, epoxy resin, phenolic resin, polyamide resin, or polyimide resin.

The auxiliary electrode 161 may be disposed on the first planarizing layer 116. The auxiliary electrode 161 may be connected to the drain electrode 123 of the thin film transistor 120 through the contact holes of the first planarizing layer 116 and the protective layer 114. The auxiliary electrode 161 may serve to electrically connect the thin film transistor 120 and the first electrode 141 of the light emitting device 140. For example, the auxiliary electrode 161 may serve to electrically connect the drain electrode 123 of the thin film transistor 120 and the first electrode 141 of the light emitting device 140. The auxiliary electrode 161 may be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. The auxiliary electrode 161 may be formed of the same material as the source electrode 122 and the drain electrode 123 of the thin film transistor 120.

The second planarizing layer 117 may be disposed on the auxiliary electrode 161 and the first planarizing layer 116. For example, the second planarizing layer 117 may be disposed to cover the auxiliary electrode 161 on the first planarizing layer 116. Further, as illustrated in FIG. 2, a contact hole may be formed in the second planarizing layer 117 to expose the auxiliary electrode 161. The second planarization layer 117 may be an organic material layer which planarizes an upper portion of the thin film transistor 120. For example, the second planarizing layer 117 may be formed of an organic material such as acryl resin, epoxy resin, phenolic resin, polyamide resin, and polyimide resin.

The first electrode 141 of the light emitting device 140 may be disposed on the second planarizing layer 117. The first electrode 141 may be electrically connected to the auxiliary electrode 161 through the contact hole formed in the second planarizing layer 117. Therefore, the first electrode 141 is electrically connected to the auxiliary electrode 161 through the contact hole formed in the second planarizing layer 117 to be electrically connected to the thin film transistor 120.

The first electrode 141 may be formed to have a multi-layered structure including a transparent conductive layer and an opaque conductive layer having high reflection efficiency. The transparent conductive layer may be formed of a material having a high work function such as indium tin oxide (ITO) or indium zinc oxide (IZO). The opaque conductive layer may be formed to have a single layer or a multi-layered structure including Al, Ag, Cu, Pb, Mo, Ti, or an alloy thereof. For example, the first electrode 141 may be formed to have a structure in which a transparent conductive layer, an opaque conductive layer, and a transparent conductive layer are sequentially laminated. However, the first electrode 141 is not limited thereto but may also be formed to have a structure in which the transparent conductive layer and the opaque conductive layer are sequentially laminated.

Since the display apparatus 100 according to the exemplary embodiment of the present disclosure is a top emission display apparatus, the first electrode 141 may be an anode electrode. When the display apparatus 100 is a bottom emission type, the first electrode 141 disposed on the second planarizing layer 117 may be a cathode electrode.

A bank 118 may be disposed on the first electrode 141 and the second planarizing layer 117. An opening may be formed in the bank 118 to expose the first electrode 141. Since the bank 118 defines an emission area of the display apparatus 100, the bank 118 may also be referred to as a pixel definition layer. A spacer 119 may be further disposed on the bank 118.

The bank 118 and the spacer 119 may be formed of the same material. Further, the bank 118 and the spacer 119 may be formed of an organic material. For example, the bank 118 and the spacer 119 may be formed of polyimide, acryl, or benzocyclobutene (BCB) resin, but the present disclosure is not limited thereto.

Further, an emission structure 142 including an emission layer may be further disposed on the first electrode 141. The emission structure 142 may be formed such that a hole layer, an emission layer, and an electron layer are laminated on the first electrode 141 in this order or a reverse order. Further, the emission structure 142 may include first and second emission structures which are opposite to each other with a charge generating layer therebetween. In this case, any one of the first and second emission structures generates blue light and the other one of the first and second emission structures generates yellow-green light so that white light may be generated by the first and the second emission structures. The white light generated in the emission structure 142 is incident onto a color filter (not illustrated) disposed above the emission structure 142 to implement color images. In addition, individual emission structures 142 generate color light corresponding to individual sub pixels without having separate color filters to implement color images. That is, the emission structure 142 of a red R sub pixel generates red light, the emission structure 142 of a green G sub pixel generates green light, and the emission structure 142 of a blue B sub pixel generates blue light.

The second electrode 143 may be further disposed on the emission structure 142. The second electrode 143 may be disposed on the emission structure 142 to be opposite to the first electrode 141 with the emission structure 142 therebetween. In the display apparatus 100 according to the exemplary embodiment of the present disclosure, the second electrode 143 may be a cathode electrode. The encapsulating unit 210 may be further disposed on the second electrode 143 of the light emitting device 140 to suppress moisture permeation.

The second electrode 143 may extend to the non-display area NDA which will be described below. The second electrode 143 which extends to the non-display area NDA may be connected to a connection electrode 150 which is exposed through the contact hole of the bank 118. The connection electrode 150 may serve to electrically connect the second power supply electrode VSSE and the second electrode 143 of the light emitting device 140 to each other.

Referring to FIG. 2, the encapsulating unit 210 is formed to cover the light emitting device 140 to suppress the moisture from penetrating onto the light emitting device 140. For example, the encapsulating unit 210 may be further disposed on the second electrode 143 of the light emitting device 140 to suppress moisture permeation. The encapsulating unit 210 may not be disposed in the bending area BA of the substrate 110.

The encapsulating unit 210 may include at least one inorganic encapsulating layer and at least one organic encapsulating layer. For example, the encapsulating unit 210 may include a first inorganic encapsulating layer 211, a second organic encapsulating layer 212, and a third inorganic encapsulating layer 213. The first inorganic encapsulating layer 211 of the encapsulating unit 210 may be disposed on the second electrode 143. The second organic encapsulating layer 212 may be disposed on the first inorganic encapsulating layer 211. Further, the third inorganic encapsulating layer 213 may be disposed on the second organic encapsulating layer 212. The first inorganic encapsulating layer 211 and the third inorganic encapsulating layer 213 of the encapsulating unit 210 may be formed of an inorganic material such as silicon nitride SiNx or silicon oxide SiOx. The second organic encapsulating layer 212 of the encapsulating unit 210 may be formed of an organic material such as acryl resin, epoxy resin, phenolic resin, polyamide resin, or polyimide resin.

Figure 3A:
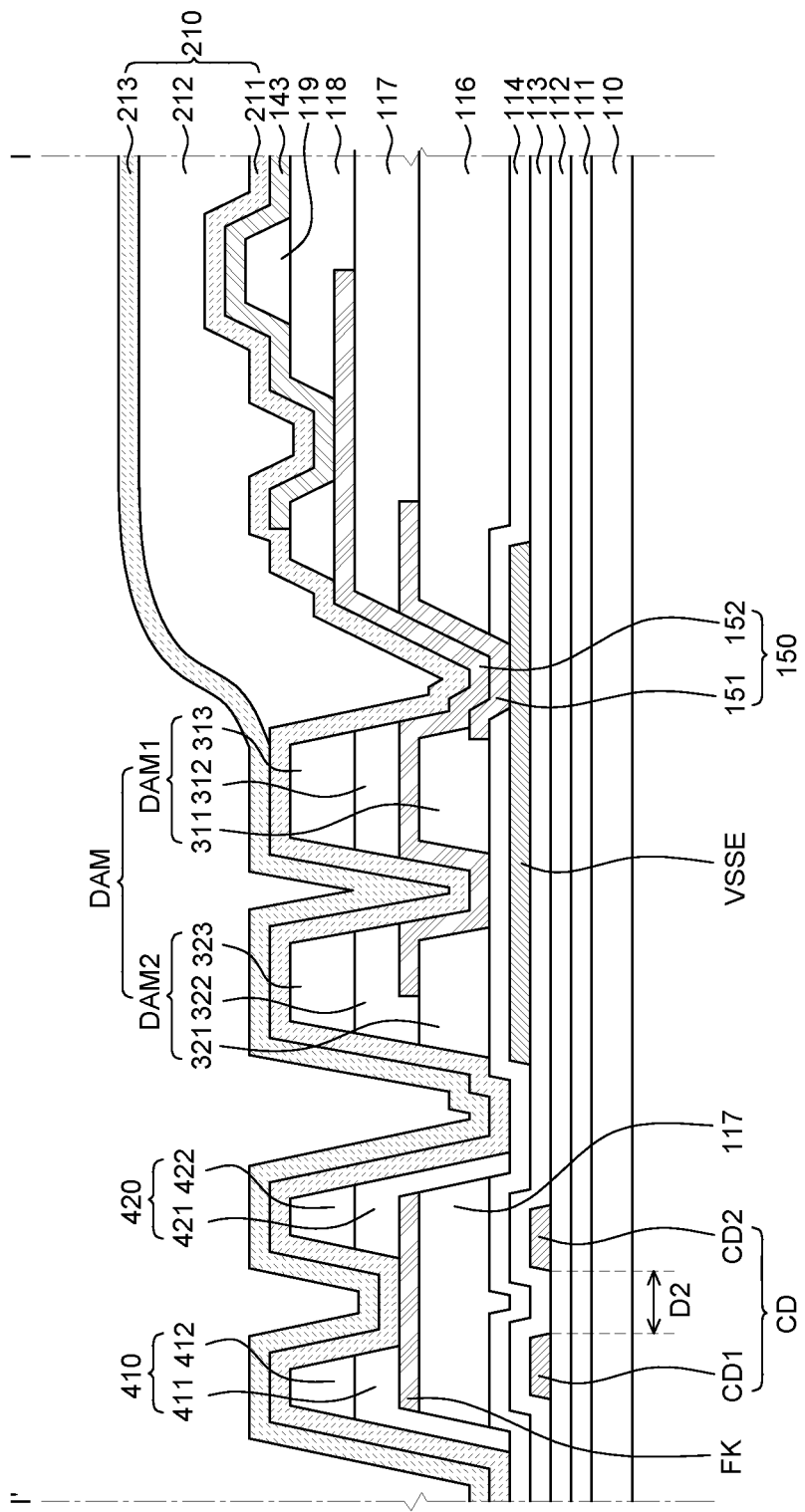
FIG. 3A is a cross-sectional view taken along the line I-I' of FIG. 1.

FIG. 3A is a cross-sectional view taken along the line I-I' of FIG. 1. FIG. 3B is a cross-sectional view taken along the line II-II' of FIG. 1. FIG. 3A is a view illustrating a cross-sectional structure of the second power supply electrode VSSE, the crack detecting unit CD, the alignment reference unit FK, and a dam area disposed in the non-display area NDA. FIG. 3B is a view illustrating a cross-sectional structure of the second power supply electrode VSSE, the crack detecting unit CD, and a dam DAM area disposed in the non-display area NDA. A portion which is substantially the same as the component illustrated in FIG. 2 will be briefly described or the description thereof will be omitted in FIGS. 3A and 3B. Although not shown in the figures, a back plate that supports the substrate 110 may be disposed on a rear surface of the substrate 110 that is opposite of a front surface of the substrate 110. Furthermore, although not shown, a polarizer may be disposed on the encapsulating unit 210.

Figure 3B:
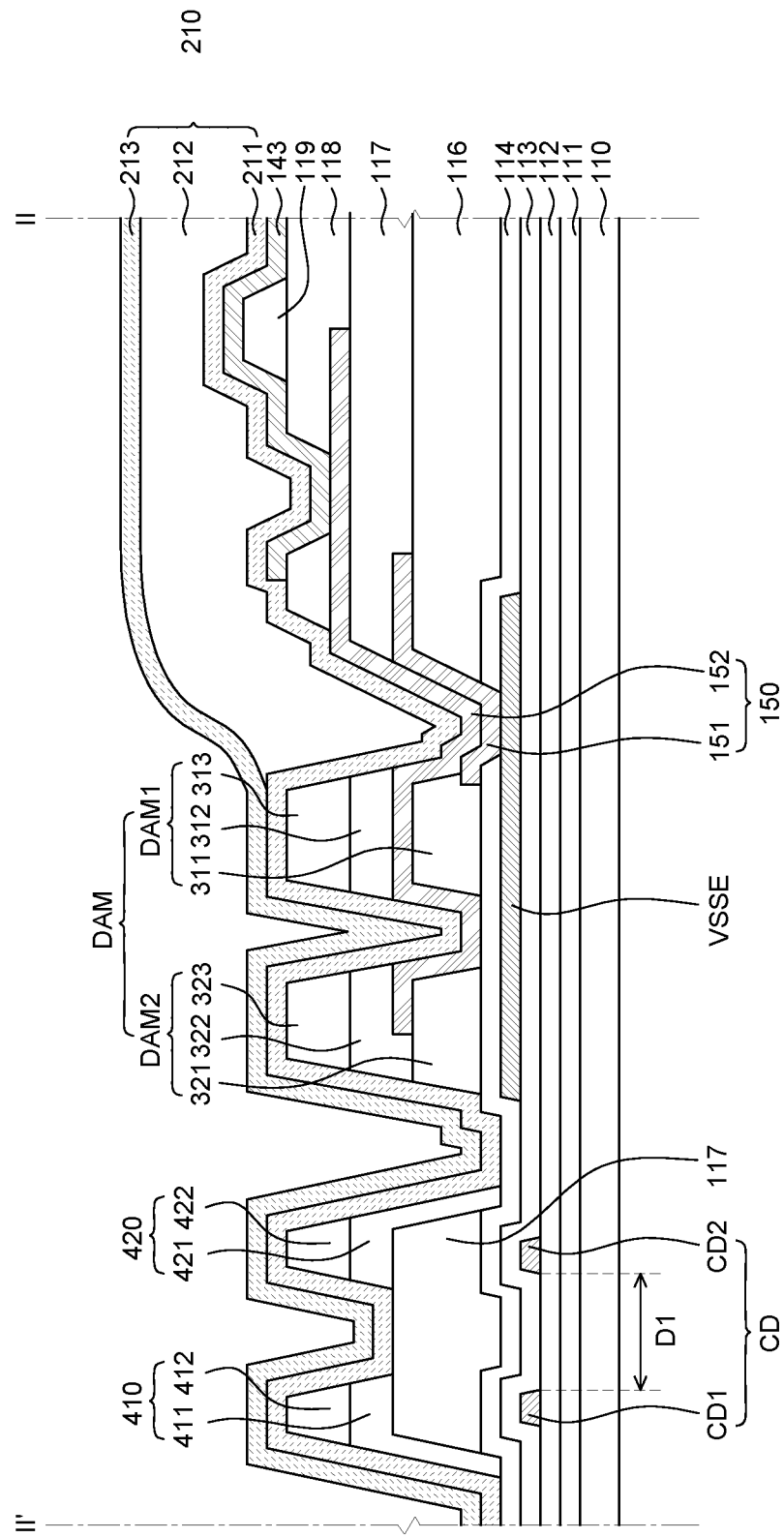
FIG. 3B is a cross-sectional view taken along the line II-II' of FIG. 1.

Referring to FIGS. 3A and 3B, the crack detecting unit CD may be disposed on the gate insulating layer 112. For example, the first crack detecting unit CD1 and the second crack detecting unit CD2 of the crack detecting unit CD may be disposed. In an area where the alignment reference unit FK is not disposed, the first crack detecting unit CD1 and the second crack detecting unit CD2 may be disposed to be spaced apart from each other with a first distance D1. In an area where the alignment reference unit FK is disposed, the first crack detecting unit CD1 and the second crack detecting unit CD2 may be disposed to be spaced apart from each other with a second distance D2 which is shorter than the first distance D1.

The interlayer insulating layer 113 which covers the crack detecting unit CD may be disposed on the gate insulating layer 112.

The second power supply electrode VSSE may be disposed on the interlayer insulating layer 113. The second power supply electrode VSSE may be disposed on the same layer as the source electrode 122 and the drain electrode 123 of the thin film transistor 120 and may be formed of the same material. However, the second power supply electrode VSSE is not limited thereto and may be disposed on the same layer as the auxiliary electrode 161 and formed of the same material.

The second power supply electrode VSSE may be supplied with a second power Vss which is a low potential voltage. Further, the second power Vss may be supplied to the sub pixel P of the display area DA through the second power supply electrode VSSE. As it will be described below, the second power supply electrode VSSE may be electrically connected to the second electrode 143 of the light emitting device 140 to supply a second power Vss to the second electrode 143.

Referring to FIGS. 3A and 3B, in the non-display area NDA, the protective layer 114 may be disposed on the second power supply electrode VSSE. The protective layer 114 may be disposed on the interlayer insulating layer 113 to cover the second power supply electrode VSSE. Further, the protective layer 114 may include a contact hole which exposes the second power supply electrode VSSE.

The first planarizing layer 116 may be disposed on the protective layer 114. The first planarizing layer 116 may include an opening which exposes the second power supply electrode VSSE. Therefore, the first planarizing layer 116 may not cover the contact hole of the protective layer 114.

For example, the opening of the first planarizing layer 116 may overlap the contact hole of the protective layer 114. The opening of the first planarizing layer 116 may expose the contact hole of the protective layer 114.

A dam DAM may be disposed on the protective layer 114 to be spaced apart from one side of the first planarizing layer 116. The dam DAM may include a first dam DAM1 which is spaced apart from one side of the first planarizing layer 116 and a second dam DAM2 which is spaced apart from the first dam DAM1. The first dam DAM1 may be disposed between the display area DA and the second dam DAM2. The first dam DAM1 may be disposed between one side of the first planarizing layer 116 and the second dam DAM2 such that the first dam DAM1 is closer to the display area DA than the second dam DAM2.

The first dam DAM1 and the second dam DAM2 may be disposed to overlap with at least a portion of the second power supply electrode VSSE. The first dam DAM1 and the second dam DAM2 are on the protective layer 114 that covers the second power supply electrodes VSSE in one embodiment.

The first dam DAM1 and the second dam DAM2 may be formed of a multi-layer formed of an organic material layer. For example, referring to FIGS. 3A and 3B, the first dam DAM1 and the second dam DAM2 may be formed of a triple layer. The first dam DAM1 may be formed of a 1a-th dam layer 311, a 1b-th dam layer 312 on the 1a-th dam layer 311, and a 1c-th dam layer 313 on the 1b-th dam layer 312. The second dam DAM2 may be formed of a 2a-th dam layer 321, a 2b-th dam layer 322 on the 2a-th dam layer 321, and a 2c-th dam layer 323 on the 2b-th dam layer 322. The 1a-th dam layer 311 and the 2a-th dam layer 321 may be formed by the same process as the second planarizing layer 117 and may be formed of the same material. The 1b-th dam layer 312 and the 2b-th dam layer 322 may be formed by the same process as the bank 118 and may be formed of the same material. Further, the 1c-th dam layer 313 and the 2c-th dam layer 323 may be formed by the same process as the spacer 119 and may be formed of the same material.

The 1b-th dam layer 312 and the 1c-th dam layer 313 may be formed of the same material and may be formed together by one process. The 2b-th dam layer 322 and the 2c-th dam layer 323 may also be formed of the same material and may be formed together by one process. When the 1b-th dam layer 312 and the 1c-th dam layer 313 and the 2b-th dam layer 322 and the 2c-th dam layer 323 are the same material, the dam DAM may be formed by a double layer.

Referring to FIGS. 3A and 3B, a first connection electrode 151 of the connection electrode 150 may be disposed on the first planarizing layer 116 and the protective layer 114. The first connection electrode 151 of the connection electrode 150 may be connected to the second power supply electrode VSSE which is exposed through the opening of the first planarizing layer 116 and the contact hole of the protective layer 114. The connection electrode 150 may electrically connect the second power supply electrode VSSE and the second electrode 143 of the light emitting device 140 to each other. One side of the first connection electrode 151 may be disposed between the 1a-th dam layer 311 of the first dam DAM1 and the protective layer 114. The 1a-th dam layer 311 of the first dam DAM1 may be disposed to cover one side of the first connection electrode 151 of the connection electrode 150.

The second planarizing layer 117 may be disposed on the crack detecting unit CD, the first connection electrode 151, and the first planarizing layer 116. The second planarizing layer 117 may be disposed to cover one end of the first connection electrode 151 while DAM1 covers another end of the first connection electrode 151. Further, the second planarizing layer 117 may not be disposed in a portion of an area where the second power supply electrode VSSE is located. Further, the second planarizing layer 117 may not be disposed in an area adjacent to the display area DA among the areas where the first gate driver GIPa of the gate driver GIP is located. For example, the second planarizing layer 117 may not be disposed in an area which is adjacent to the display area DA and overlaps the first gate driver GIPa.

Referring to FIGS. 3A and 3B, the second planarizing layer 117 may be disposed on the first crack detecting unit CD1 and the second crack detecting unit CD2 of the crack detecting unit CD. For example, the second planarizing layer 117 may be formed to overlap the first crack detecting unit CD1 and the second crack detecting unit CD2. The second planarizing layer 117 which is disposed to overlap the first crack detecting unit CD1 and the second crack detecting unit CD2 may be spaced apart from the second dam DAM2. Further, the second planarizing layer 117 which is disposed to overlap the first crack detecting unit CD1 and the second crack detecting unit CD2 may be in direct contact with an upper surface of the protective layer 114.

The second planarizing layer 117 may include an opening which exposes the first connection electrode 151 disposed in an area where the first dam DAM1 and the first planarizing layer 116 are spaced apart from each other.

Referring to FIG. 3A, the alignment reference unit FK and the second connection electrode 152 of the connection electrode 150 may be disposed on the second planarizing layer 117. The second connection electrode 152 may be disposed on the 1a-th dam layer 311 and the 2a-th dam layer 321. The alignment reference unit FK may be disposed on the second planarizing layer 117 which is disposed to cover the first crack detecting unit CD1 and the second crack detecting unit CD2. For example, the alignment reference unit FK may be disposed to overlap the first crack detecting unit CD1 and the second crack detecting unit CD2. The alignment reference unit FK is disposed on the second planarizing layer 117 and overlaps the first crack detecting unit CD1 and the second crack detecting unit CD2.

The alignment reference unit FK and the second connection electrode 152 may be formed by the same process as the first electrode 141 of the light emitting device 140 and may be formed of the same material.

Referring to FIGS. 3A and 3B, in the non-display area NDA, the second connection electrode 152 is disposed in an area where the first dam DAM1 and the first planarizing layer 116 are spaced apart from each other to be in direct contact with the upper surface of the first connection electrode 151. The second connection electrode 152 may be disposed on the upper surface of the second planarizing layer 117. The second connection electrode 152 may be disposed between the 1a-th dam layer 311 and the 1b-th dam layer 312. The second connection electrode 152 may be disposed between the 2a-th dam layer 321 and the 2b-th dam layer 322. The second connection electrode 152 may also be disposed in an area where the first dam DAM1 and the second dam DAM2 are spaced apart from each other.

Referring to FIGS. 3A and 3B, the bank 118 may be disposed on the second connection electrode 152 disposed on the second planarizing layer 117. The bank 118 may include a contact hole which exposes the second connection electrode 152. The spacer 119 may be disposed on the bank 118.

Further, the second electrode 143 of the light emitting device 140 may be disposed on the bank 118 and the spacer 119 to extend to the non-display area NDA. The second electrode 143 which extends to the non-display area NDA may be connected to the second connection electrode 152 which is exposed through the contact hole of the bank 118. The second connection electrode 152 electrically connects the second power supply electrode VSSE and the second electrode 143 of the light emitting device 140 to each other.

Referring to FIG. 3A, a first crack blocking unit 410 and a second crack blocking unit 420 may be disposed on the alignment reference unit FK. For example, the first crack blocking unit 410 may be disposed to cover one side of the alignment reference unit FK. Further, the second crack blocking unit 420 may be disposed to cover the other side of the alignment reference unit FK.

A first crack blocking lower layer 411 of the first crack blocking unit 410 may be disposed to cover one side of the alignment reference unit FK. A second crack blocking lower layer 421 of the second crack blocking unit 420 may be disposed to cover the other side of the alignment reference unit FK. The first crack blocking lower layer 411 and the second crack blocking lower layer 421 may be formed by the same process as the bank 118. Further, the first crack blocking lower layer 411 and the second crack blocking lower layer 421 may be formed of the same material as the bank 118.

A first crack blocking upper layer 412 may be disposed on the first crack blocking lower layer 411. Further, a second crack blocking upper layer 422 may be disposed on the second crack blocking lower layer 421. The first crack blocking upper layer 412 and the second crack blocking upper layer 422 may be formed by the same process as the spacer 119 and may be formed of the same material.

Even though the first crack blocking unit 410 and the second crack blocking unit 420 are illustrated as a double layer formed of a lower layer and an upper layer but is not limited thereto. The first crack blocking unit 410 and the second crack blocking unit 420 may be formed as a single layer. The first crack blocking unit 410 and the second crack blocking unit 420 may be disposed to be spaced apart from each other to expose an upper surface of the alignment reference unit FK. For example, the first crack blocking unit 410 may be disposed to overlap the first crack detecting unit CD1 and one side of the alignment reference unit FK. The second crack blocking unit 420 may be disposed so as to overlap the second crack detecting unit CD2 and the other side of the alignment reference unit FK. The area where the first crack blocking unit 410 and the second crack blocking unit 420 are spaced apart from each other may overlap the area where the first crack detecting unit CD1 and the second crack detecting unit CD2 are spaced apart from each other.

Referring to FIG. 3B, the first crack blocking lower layer 411 of the first crack blocking unit 410 may be disposed to cover one side of the second planarizing layer 117 disposed in an area corresponding to the first crack detecting unit CD1 and the second crack detecting unit CD2. Further, the second crack blocking lower layer 421 of the second crack blocking unit 420 may be disposed to cover the other side of the second planarizing layer 117 disposed in an area corresponding to the first crack detecting unit CD1 and the second crack detecting unit CD2. As described above, in the area where the alignment reference unit FK is not disposed, the first crack blocking lower layer 411 and the second crack blocking lower layer 421 may be in direct contact with the upper surface of the second planarizing layer 117 disposed in an area corresponding to the first crack detecting unit CD1 and the second crack detecting unit CD2.

Further, the first crack blocking unit 410 and the second crack blocking unit 420 may be disposed to be spaced apart from each other to expose the upper surface of the second planarizing layer 117 disposed in an area corresponding to the first crack detecting unit CD1 and the second crack detecting unit CD2. For example, the first crack blocking unit 410 may be disposed to overlap the first crack detecting unit CD1. Further, the second crack blocking unit 420 may be disposed to overlap the second crack detecting unit CD2. The area formed by the first crack blocking unit 410 and the second crack blocking unit 420 spaced apart from each other may overlap the area formed by the first crack detecting unit CD1 and the second crack detecting unit CD2 spaced apart from each other.

Referring to FIGS. 3A and 3B, the encapsulating unit 210 may be disposed on the first crack blocking unit 410, the alignment reference unit FK, the second crack blocking unit 420, the second electrode 143, and the dam DAM. The first inorganic encapsulating layer 211 of the encapsulating unit 210 may be disposed to cover the first crack blocking unit 410, the alignment reference unit FK, the second crack blocking unit 420, the second electrode 143 extending to the non-display area NDA, the second connection electrode 152, and the dam DAM. The second organic encapsulating layer 212 may be disposed to cover the second electrode 143 which extends to the non-display area NDA and the second connection electrode 150. Further, the third inorganic encapsulating layer 213 may be disposed to cover the first crack blocking unit 410, the second crack blocking unit 420, the second electrode 143, the second connection electrode 150, and the dam DAM. However, the present disclosure is not limited thereto and the first inorganic encapsulating layer 211 and the third inorganic encapsulating layer 213 may not cover the first crack blocking unit 410, the alignment reference unit FK, and the second crack blocking unit 420.

The first inorganic encapsulating layer 211 and the third inorganic encapsulating layer 213 may be in contact with each other on the dam, the first crack blocking unit 410 and the second crack blocking unit 420.

The display apparatus 100 according to the exemplary embodiment of the present disclosure disposes the alignment reference unit FK to overlap the first crack detecting unit CD1 and the second crack detecting unit CD2 in the non-display area NDA so that the back plate for supporting the rear surface of the substrate 110 may be accurately disposed on the lower surface of the substrate 110. Further, the alignment reference unit FK serves as a guide so that the polarizer disposed on the encapsulating unit 210 of the substrate 110 is attached without causing misalignment. However, the alignment reference unit FK is additionally disposed in a specific area of the substrate 110, which may cause a step between an area where the alignment reference unit FK is disposed and an area where the alignment reference unit FK is not disposed. Therefore, the display apparatus 100 according to another exemplary embodiment of the present disclosure suggests a laminating structure in which the step is not caused by the alignment reference unit FK.

Figure 4:
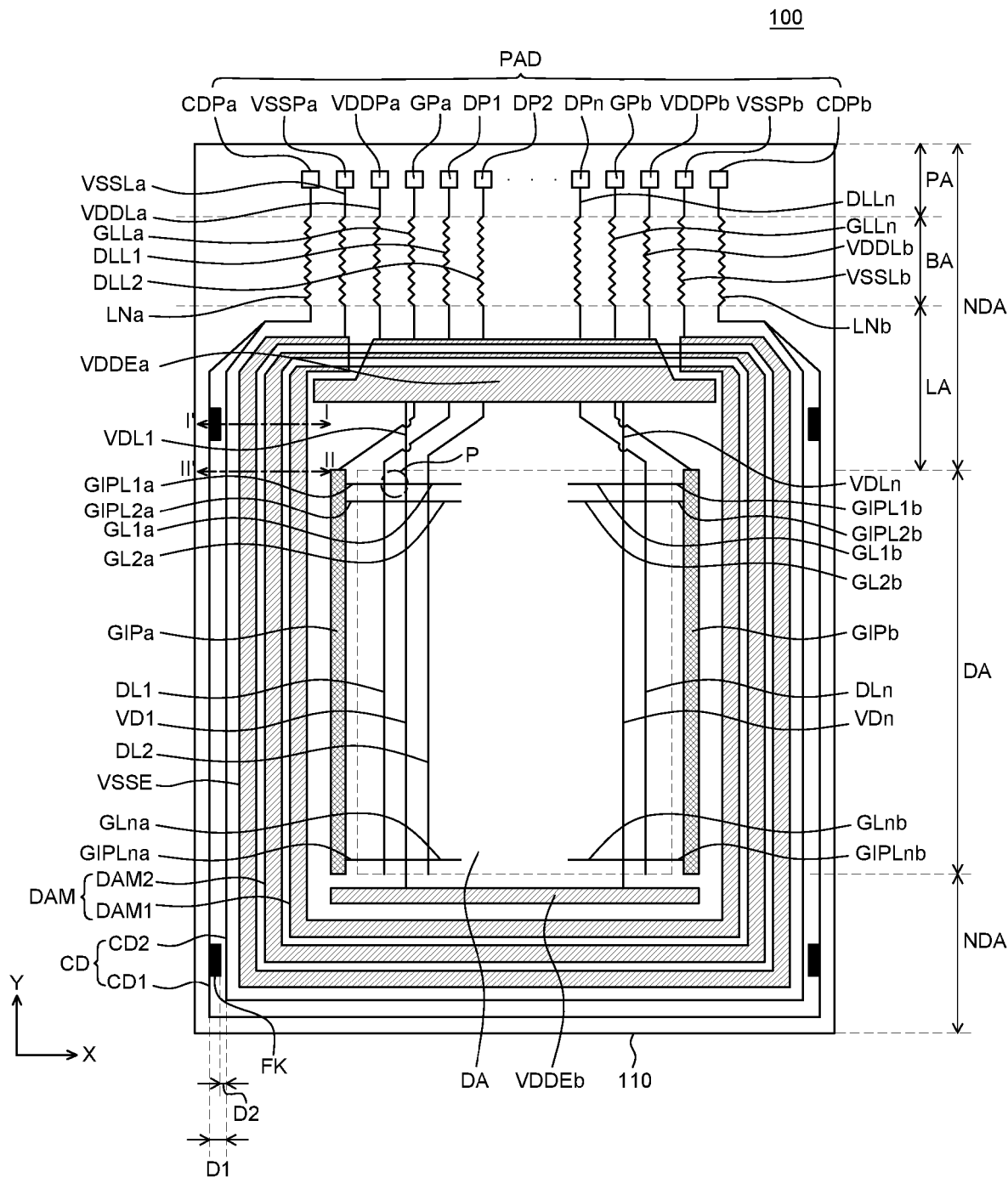
FIG. 4 is a plan view of an electroluminescent display apparatus according to another exemplary embodiment of the present disclosure.
Figure 5A:
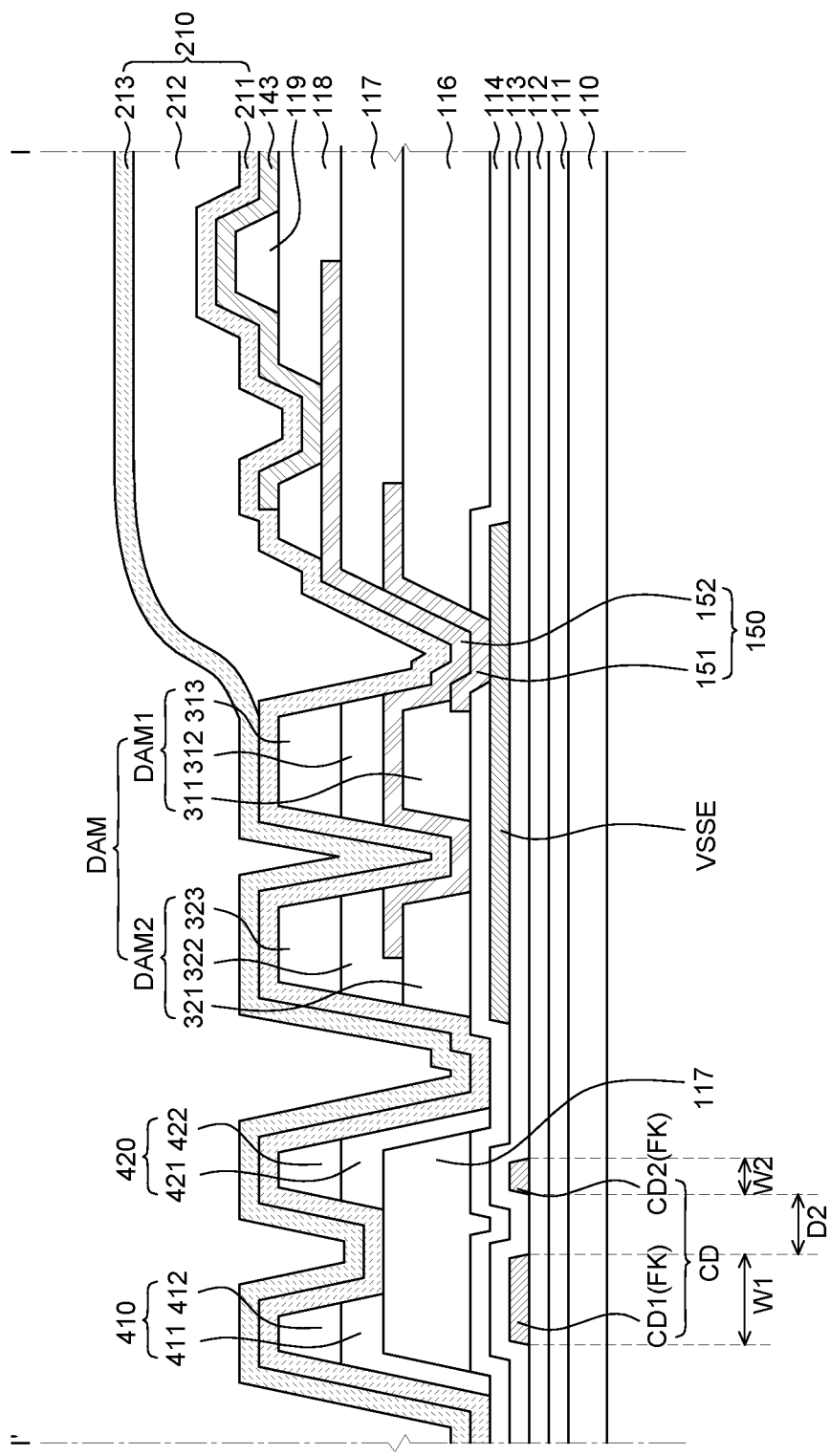
FIG. 5A is a cross-sectional view taken along the line I-I' of FIG. 4.
Figure 5B:
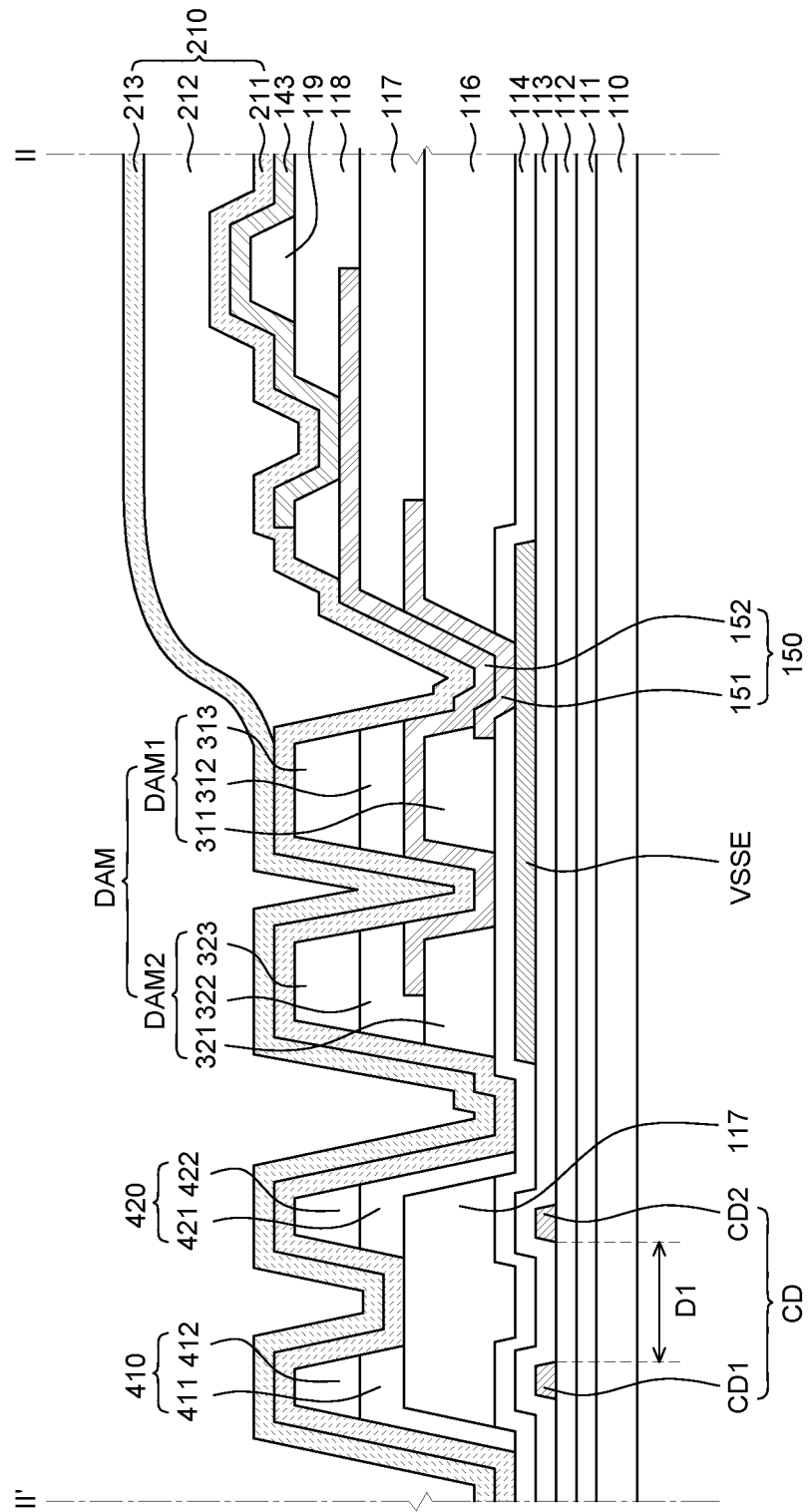
FIG. 5B is a cross-sectional view taken along the line II-II' of FIG. 4.

FIG. 4 is a schematic plan view of an electroluminescent display apparatus according to another embodiment of the present disclosure. FIG. 5A is a cross-sectional view taken along the line I-I' of FIG. 4. FIG. 5B is a cross-sectional view taken along the line II-II' of FIG. 4. In FIG. 4, a portion which is substantially the same as the component illustrated in FIG. 1 will be briefly described or the description thereof will be omitted. Further, in FIGS. 5A and 5B, a portion which is substantially the same as the component illustrated in FIGS. 2 to 3B will be briefly described or the description thereof will be omitted.

Referring to FIGS. 4 and 5A, the alignment reference unit FK may be configured to be integrated with the first crack detecting unit CD1. For example, the alignment reference unit FK may be formed by expanding a width of the first crack detecting unit CD1. The first crack detecting unit CD1 and the alignment reference unit FK may be integrally formed. The alignment reference unit FK and the first crack detecting unit CD1 may be spaced apart from the second crack detecting unit CD2. However, the present disclosure is not limited thereto, and the alignment reference unit FK may be formed to be integrated with the second crack detecting unit CD2. When the alignment reference unit FK is formed to be integrated with the second crack detecting unit CD2, the alignment reference unit FK may be spaced apart from the first crack detecting unit CD1.

Referring to FIG. 5A, the first crack detection unit CD1 and alignment reference unit FK may be formed to have a first width. The second crack detecting unit CD2 may have a second width which is smaller than the first width.

The alignment reference unit FK and the second crack detecting unit CD2 may be disposed on the same layer. For example, the alignment reference unit FK, the first crack detecting unit CD1, and the second crack detecting unit CD2 may be disposed on the gate insulating layer 112. The alignment reference unit FK, the first crack detecting unit CD1, and the second crack detecting unit CD2 may be formed of the same material. For example, the alignment reference unit FK, the first crack detecting unit CD1, and the second crack detecting unit CD2 may be formed of the same material as the gate electrode 124 of the thin film transistor 120.

In an area where the alignment reference unit FK is disposed, the first crack detecting unit CD1 and the second crack detecting unit CD2 may be spaced apart from each other with a second distance D2. In an area where the alignment reference unit FK is not disposed, the first crack detecting unit CD1 and the second crack detecting unit CD2 may be spaced apart from each other with a first distance D1 which is longer than the second distance D2.

In the display apparatus 100 according to another exemplary embodiment of the present disclosure, the alignment reference unit FK is formed to be integrated with the first crack blocking unit CD1 so that the alignment reference unit FK, the first crack detecting unit CD1, and the second crack detecting unit CD2 may be disposed on the same layer. The step of the upper surface may be compensated by the second planarizing layer 117 which is disposed in an area corresponding to the alignment reference unit FK, the first crack detecting unit CD1, and the second crack detecting unit CD2. The display apparatus according to the exemplary embodiment of the present disclosure may configure the alignment reference unit FK to be integrally formed with the first crack detecting unit CD1 or the second crack detecting unit CD2. A separate layer for configuring the alignment reference unit FK may not be disposed on the upper surface of the second planarizing layer 117 which is disposed in the area corresponding to the first crack detecting unit CD1 and the second crack detecting unit CD2. Therefore, referring to FIGS. 5A and 5B, in the area where the alignment reference unit FK is disposed and the area where the alignment reference unit FK is not disposed, the laminating structure disposed on the second planarizing layer 117 disposed in the area corresponding to the first crack detecting unit CD1 and the second crack detecting unit CD2 may be the same.

Therefore, a display apparatus in which a step is not caused between the area where the alignment reference unit FK is disposed and the area where the alignment reference unit FK is not disposed may be provided.

Figure 6:
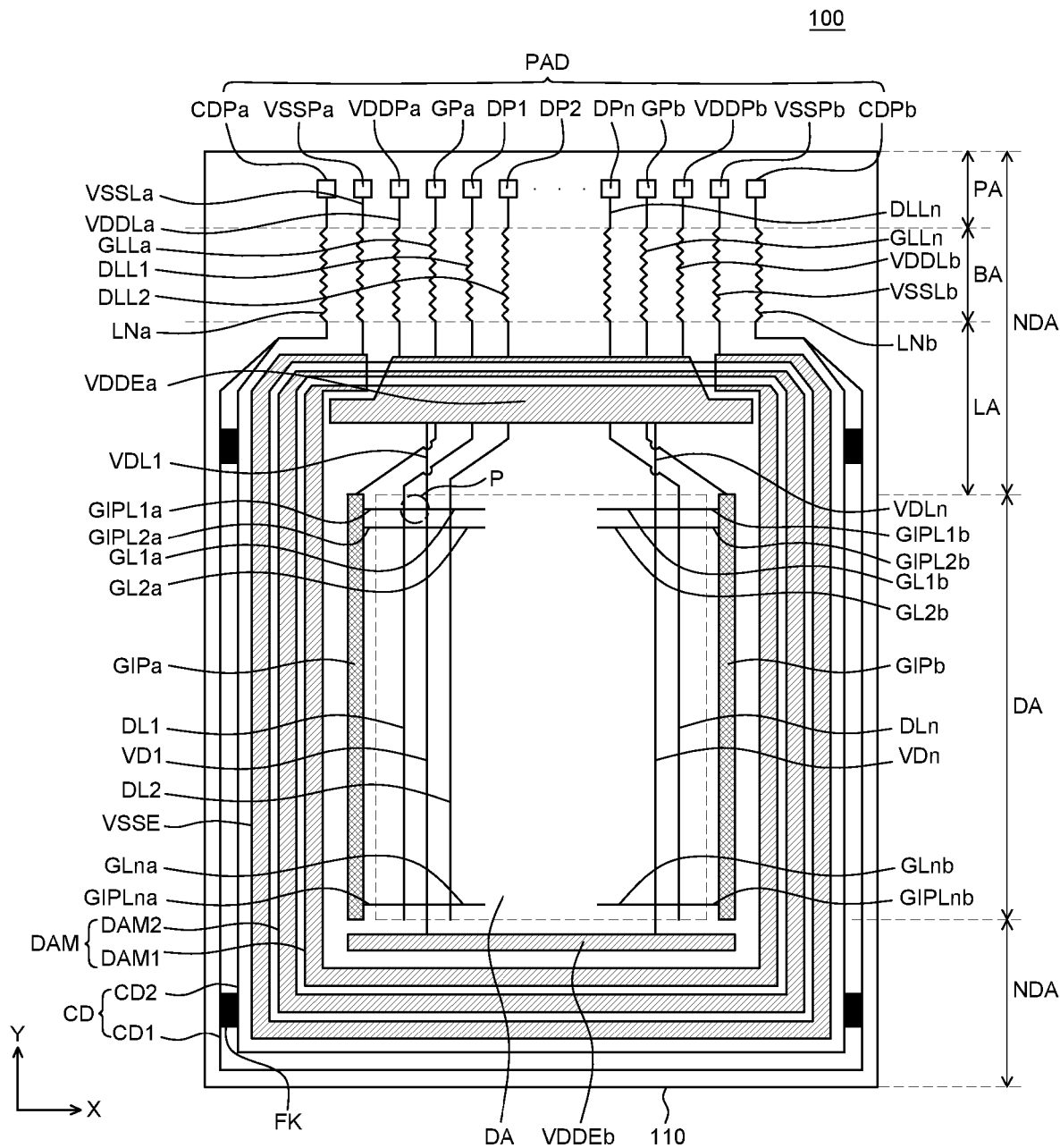
FIG. 6 is a plan view of an electroluminescent display apparatus according to another exemplary embodiment of the present disclosure.

FIG. 6 is a schematic plan view of a display apparatus according to another exemplary embodiment of the present disclosure. In FIG. 6, a portion which is substantially the same as the component illustrated in FIG. 4 will be briefly described or the description thereof will be omitted.

Referring to FIG. 6, the alignment reference unit FK may be formed to be integrated with the first crack detecting unit CD1 and the second crack detecting unit CD2. The alignment reference unit FK may connect the first crack detecting unit CD1 and the second crack detecting unit CD2 to each other. For example, the alignment reference unit FK is disposed between the first crack detecting unit CD1 and the second crack detecting unit CD2 and may be formed to be integrated with the first crack detecting unit CD1 and the second crack detecting unit CD2. When the alignment reference unit FK is configured to be integrated with the first crack detecting unit CD1 and the second crack detecting unit CD2 to electrically connect the first crack detecting unit CD1 and the second crack detecting unit CD2, the first crack detecting unit CD1 and the second crack detecting unit CD2 may be formed as a plurality of parallel connection structures by the alignment reference unit FK. Further, when a crack is caused by the external force, the change in the resistance of the first crack detecting unit CD1 and the second crack detecting unit CD2 connected as a plurality of parallel structures by the alignment reference unit FK is measured to identify the crack generating position and the number of cracks.

In some embodiments, the display area DA may be divided into quadrants, where each quadrant corresponds to a different parallel connection structure. The parallel structures of the first crack detecting unit CD1 and the second crack detecting unit CD2 may be connected through bridge resistors. Because a resistance value of the parallel structures and the bridge resistors are different when a crack is generated, the change in resistance measured through the first crack detecting pad CDPa and the second track detecting pad CDPb can be used to determine which quadrant the crack lies in.

For example, referring to FIG. 6, the crack may be generated in the first crack detecting unit CD1 disposed at the left side and the crack may be generated in the second crack detecting unit CD2 disposed at the right side. Even though the crack is generated in the first crack detecting unit CD1 and the second track detecting unit CD2, the first crack detecting unit CD1 and the second track detecting unit CD2 are connected as a plurality of parallel structures by the alignment reference unit FK. Therefore, the resistance may be measured through the first crack detecting pad CDPa and the second track detecting pad CDPb. Further, the resistance which is changed due to the crack is measured by the first crack detecting pad CDPa and the second crack detecting pad CDPb to identify a crack generating position and the number of cracks.

The exemplary embodiments of the present disclosure can also be described as follows:

According to an aspect of the present disclosure, there is provided an electroluminescent display apparatus. The electroluminescent display apparatus includes a substrate including a display area and a non-display area which surrounds the display area, a crack detecting unit on the substrate in the non-display area, an interlayer insulating layer disposed to cover the crack detecting unit, a power supply electrode which is located on the interlayer insulating layer and is disposed between the crack detecting unit and the display area, a protective layer disposed to cover the power supply electrode, a planarizing layer which is located on the protective layer and is disposed to overlap the crack detecting unit, and an alignment reference unit which is located on the planarizing layer and overlaps the crack detecting unit.

The electroluminescent display apparatus may further include a thin film transistor which is disposed in the display area and includes a gate electrode, a source electrode, and a drain electrode; and a light emitting device which is disposed on the thin film transistor and includes a first electrode connected to the thin film transistor, an emission structure, and a second electrode connected to the power supply electrode. The first electrode of the light emitting device may be disposed on the planarizing layer.

The alignment reference unit may be formed of the same material as the first electrode.

The crack detecting unit may include a first crack detecting unit and a second crack detecting unit disposed between the first crack detecting unit and the power supply electrode.

The first crack detecting unit and the second crack detecting unit may be spaced apart from each other with a first distance.

The first crack detecting unit and the second crack detecting unit in an area overlapping the alignment reference unit may be disposed to be spaced apart from each other with a second distance which is shorter than the first distance.

The electroluminescent display apparatus may further include a first crack blocking unit disposed to cover one side of the alignment reference unit and a second crack blocking unit disposed to cover the other side of the alignment reference unit.

The electroluminescent display apparatus may further include a dam which is disposed between the alignment reference unit and the display area and overlaps the power supply electrode.

According to another aspect of the present disclosure, there is provided an electroluminescent display apparatus. The electroluminescent display apparatus includes a substrate including a display area and a non-display area which is adjacent to the display area; a first crack detecting unit on the substrate and a second crack detecting unit which is spaced apart from the first crack detecting unit, in the non-display area; an alignment reference unit which is integrally formed with the first crack detecting unit and is formed of the same material as the first crack detecting unit; a power supply electrode which is disposed between the second crack detecting unit and the display area and supplies a power to the light emitting device; and a dam which is disposed between the second crack detecting unit and the display area and overlaps the power supply electrode.

The second crack detecting unit may be disposed between the power supply electrode and the first crack detecting unit.

The dam may include a first dam disposed between the second crack detecting unit and the display area and a second dam disposed between the first dam and the second crack detecting unit.

The second crack detecting unit may be disposed between the second dam and the first crack detecting unit.

The electroluminescent display apparatus may further include a thin film transistor which is disposed in the display area and includes a gate electrode, a source electrode, and a drain electrode, wherein the light emitting device includes a first electrode connected to the thin film transistor, an emission structure on the first electrode, and a second electrode connected to the power supply electrode.

The first crack detecting unit, the second crack detecting unit, and the alignment reference unit may be formed of the same material as the gate electrode and are disposed on the same insulating layer.

The alignment reference unit may be integrally formed with the second crack detecting unit.

The alignment reference unit may be electrically connected to the first crack detecting unit and the second crack detecting unit.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An electroluminescent display apparatus comprising:
    a substrate including a display area that displays an image and a non-display area enclosing the display area, the non-display not configured to display the image;
    at least one crack detecting unit on the non-display area of the substrate, the at least one crack detecting unit configured to detect a crack in the electroluminescent display apparatus;
    an interlayer insulating layer covering the crack detecting unit;
    a power supply electrode configured to supply a voltage, the power supply electrode on the interlayer insulating layer and disposed between the crack detecting unit and the display area;
    a protective layer covering the power supply electrode;
    a planarizing layer on the protective layer, the planarizing layer overlapping the at least one crack detecting unit; and
    an alignment reference unit in the non-display area of the substrate, the alignment reference unit on the planarizing layer and overlapping the crack detecting unit in the non-display area.

2. The electroluminescent display apparatus according to claim 1, further comprising:
    a thin film transistor disposed in the display area, the thin film transistor including a gate electrode, a source electrode, and a drain electrode; and
    a light emitting device disposed on the thin film transistor, the light emitting device including a first electrode connected to the thin film transistor, an emission structure on the first electrode, and a second electrode connected to the power supply electrode,
    wherein the first electrode of the light emitting device is disposed on the planarizing layer.

3. The electroluminescent display apparatus according to claim 2, wherein the alignment reference unit is formed of a same material as the first electrode of the light emitting device.

4. The electroluminescent display apparatus according to claim 1, wherein the at least one crack detecting unit includes a first crack detecting unit and a second crack detecting unit, the second crack detecting unit disposed between the first crack detecting unit and the power supply electrode.

5. The electroluminescent display apparatus according to claim 4, wherein a first portion of the first crack detecting unit and a first portion of the second crack detecting unit are not overlapped by the alignment reference unit, the first portion of the first crack detecting unit and the first portion of the second crack detecting unit spaced apart from each other at a first distance.

6. The electroluminescent display apparatus according to claim 5, wherein a second portion of the first crack detecting unit and a second portion of the second crack detecting unit are overlapped by the alignment reference unit, the second portion of the first crack detecting unit and the second portion of the second crack detecting unit spaced apart from each other at a second distance that is less than the first distance.

7. The electroluminescent display apparatus according to claim 1, further comprising:
    a first crack blocking unit in the non-display area, the first crack blocking unit covering a first end of the alignment reference unit; and
    a second crack blocking unit in the non-display area, the second crack blocking unit covering a second end of the alignment reference unit.

8. The electroluminescent display apparatus according to claim 1, further comprising:
    a dam disposed between the alignment reference unit and the display area, the dam overlapping the power supply electrode.

9. An electroluminescent display apparatus, comprising:
    a substrate including a display area that displays an image and a non-display area enclosing the display area;
    a first crack detecting unit in the non-display area of the substrate, the first crack detecting unit configured to identify a crack in the electroluminescent display apparatus;
    a second crack detecting unit in the non-display area of the substrate, the second crack detecting unit spaced apart from the first crack detecting unit, wherein the second crack detecting unit is configured to identify the crack in the electroluminescent display apparatus;
    an alignment reference unit integrally formed with at least the first crack detecting unit, the alignment reference unit comprising a same material as the first crack detecting unit;
    a power supply electrode disposed in the non-display area between the second crack detecting unit and the display area, the power supply electrode configured to supply power to a light emitting device included in the electroluminescent display apparatus; and
    at least one dam disposed between the second crack detecting unit and the display area, the at least one dam overlapping the power supply electrode.

10. The electroluminescent display apparatus according to claim 9, wherein the second crack detecting unit is disposed between the power supply electrode and the first crack detecting unit.

11. The electroluminescent display apparatus according to claim 9, wherein the at least one dam includes a first dam disposed between the second crack detecting unit and the display area and a second dam disposed between the first dam and the second crack detecting unit.

12. The electroluminescent display apparatus according to claim 11, wherein the second crack detecting unit is disposed between the second dam and the first crack detecting unit.

13. The electroluminescent display apparatus according to claim 9, further comprising:
a thin film transistor in the display area, the thin film transistor including a gate electrode, a source electrode, and a drain electrode,
wherein the light emitting device includes a first electrode connected to the thin film transistor, an emission structure on the first electrode, and a second electrode connected to the power supply electrode.

14. The electroluminescent display apparatus according to claim 13, wherein the first crack detecting unit, the second crack detecting unit, and the alignment reference unit comprise a same material as the gate electrode, and
wherein the first crack detecting unit, the second crack detecting unit, and the alignment reference unit are disposed on a same insulating layer.

15. The electroluminescent display apparatus according to claim 9, wherein the alignment reference unit is also integrally formed with the second crack detecting unit.

16. The electroluminescent display apparatus according to claim 15, wherein the alignment reference unit is electrically connected to the first crack detecting unit and the second crack detecting unit.

17. An electroluminescent display apparatus comprising:
a substrate including a display area and a non-display area surrounding the display area on a front surface of the substrate;
a light emitting device in the display area of the substrate;
a first crack detecting unit and a second crack detecting unit in the non-display area, the first crack detecting unit and the second crack detecting unit configured to identify one or more cracks in the electroluminescent display apparatus;
an alignment reference unit in the non-display area of the substrate; and
a back plate coupled to a rear surface of the substrate, the back plate aligned with the alignment reference unit.

18. The electroluminescent display apparatus according to claim 17, wherein the first crack detecting unit and the second crack detecting unit are electrically connected to at least one crack detecting pad that measures a change in resistance in the first crack detecting unit and the second crack detecting unit.

19. The electroluminescent display apparatus according to claim 17, wherein the alignment reference unit overlaps the first crack detecting unit and the second crack detecting unit.

20. The electroluminescent display apparatus according to claim 19, further comprising:
a planarization layer that covers the first crack detecting unit and the second crack detecting unit, wherein the alignment reference unit is on the planarization layer.

21. The electroluminescent display apparatus according to claim 17, wherein the first crack detecting unit and the second crack detecting unit are spaced apart from each other and parallel to an edge of the display area, and
wherein the first crack detecting unit is farther from the edge of the display area than the second crack detecting unit.

22. The electroluminescent display apparatus according to claim 17, wherein the alignment reference unit is integrally formed with the first crack detecting unit.

23. The electroluminescent display apparatus according to claim 22, wherein the alignment reference unit is also integrally formed with the second crack detecting unit.

24. The electroluminescent display apparatus according to claim 17, further comprising a polarizer on the substrate, the polarizer aligned with the alignment reference unit.

* * * * *